(12) United States Patent
Harada et al.

(10) Patent No.: US 9,263,682 B2
(45) Date of Patent: Feb. 16, 2016

(54) LIGHT EMITTING DEVICE AND DISPLAY UNIT

(75) Inventors: Shigeyuki Harada, Shizuoka (JP); Masaomi Sasaki, Shizuoka (JP); Mikiko Abe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 1103 days.

(21) Appl. No.: 13/195,992

(22) Filed: Aug. 2, 2011

(65) Prior Publication Data

US 2012/0032115 A1    Feb. 9, 2012

(30) Foreign Application Priority Data

Aug. 6, 2010 (JP) .................... 2010-178148
Jul. 13, 2011 (JP) .................... 2011-154838

(51) Int. Cl.
| H01L 51/54 | (2006.01) |
| H01L 51/00 | (2006.01) |
| H05B 33/14 | (2006.01) |
| H01L 51/50 | (2006.01) |

(52) U.S. Cl.
CPC .......... *H01L 51/0072* (2013.01); *H01L 51/502* (2013.01); *H05B 33/14* (2013.01); *H01L 51/0035* (2013.01); *H01L 51/0037* (2013.01); *H01L 51/0068* (2013.01); *H01L 51/0094* (2013.01); *H01L 2251/308* (2013.01)

(58) Field of Classification Search
CPC ... H01L 51/502; H01L 51/0072; H05B 33/14
See application file for complete search history.

(56) References Cited

U.S. PATENT DOCUMENTS

| 2002/0048689 A1* | 4/2002 | Igarashi et al. ............... 428/690 |
| 2004/0086745 A1* | 5/2004 | Iwakuma et al. .............. 428/690 |
| 2004/0110031 A1* | 6/2004 | Fukuda et al. ................ 428/690 |
| 2009/0096356 A1* | 4/2009 | Murase et al. ................ 313/504 |
| 2010/0108984 A1  | 5/2010 | Cho et al. |

FOREIGN PATENT DOCUMENTS

| CN | 1350768 A    | 5/2002 |
| EP | 2184333 A2   | 5/2010 |
| JP | 2009-87754   | 4/2009 |
| JP | 2009-99545   | 5/2009 |
| JP | 2009-527099  | 7/2009 |
| JP | 2010-100593  | 5/2010 |
| WO | WO2007/095173 A2 | 8/2007 |

OTHER PUBLICATIONS

Chinese patent application No. 201110226802.0.
European Search Report dated Apr. 4, 2013 in corresponding European patent application No. 11 17 6592.1.
Wang et al., "Self-Organization of Gold Nanoparticles Protected by 9-(5-Thiopentyl)-carbazole", Chinese Chemical Letters, vol. 12, No. 12, 2001, 1141-1144.

* cited by examiner

*Primary Examiner* — Michael H Wilson
(74) *Attorney, Agent, or Firm* — Cooper & Dunham LLP

(57) ABSTRACT

A light emitting device is configured to include a substrate and a luminous layer provided overlying the substrate, which includes a semiconductor nanocrystal to which a carbazole derivative is coordination-bonded or attached, the carbazole derivative having aromatic rings of a compound represented by the chemical structure 1, which is substituted by one to three substitution groups:

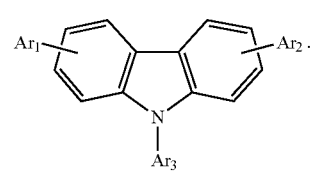

Chemical Structure 1

The one to three substitution groups are represented by the chemical structure 2:

-X-Y-Z    Chemical Structure 2.

X represents a methylene group, a carbonyloxy group, an oxycarbonyl group, a carbonyl group, an oxygen atom, and a sulfur atom, Y represents a substituted or non-substituted alkylene group, and Z represents a carboxyl group, a hydroxyl group, and a thiol group.

6 Claims, 21 Drawing Sheets

LIGHT EMITTING DEVICE AND DISPLAY UNIT

BACKGROUND OF THE INVENTION

1. Technical Field

The present invention relates to a light emitting device and a display unit.

2. Description of the Background

The behavior of nanomaterials is intermediate between those of an atom or a molecular and those of a macroscopic solid (bulk form). Nanomaterials having charge carriers and excitation confined in all three dimensional directions are referred to as quantum dots. Since a quantum dot has increased effective band gaps as its size decreases, a spectrum having its absorption wavelength and emission wavelength shifted to the short wavelength side can be obtained. In addition, by controlling both the composition of a quantum dot in addition to its size, a spectrum having a wide range of from infrared to ultraviolet can be obtained. Moreover, by controlling the size distribution, a spectrum having excellent color purity with a narrow half value width can be obtained.

For these reasons, it is expected that the quantum dot can find applications in labeling and imaging of biological molecules and light emitting devices such as a photoluminescent devices and electroluminescent device. However, insufficient luminance efficiency is a problem.

Therefore, Japanese patent application publication no. 2009-99545 (JP-2009-99545-A) describes an electroluminescence device having a pair of electrodes and an electroluminescent layer containing a luminous layer arranged between the pair of electrodes. The luminous layer has a structure in which quantum dots having a surface protected by a protective material are dispersed in a matrix material containing an organic compound. In addition, a first protective material is contained as the protective material that satisfies the following relationships (A), (B), and (C):

$$Ip(h) < Ip(m) + 0.1 \text{ eV} \quad \text{Relationship (A)}$$

$$Ea(h) > Ea(m) - 0.1 \text{ eV} \quad \text{Relationship (B)}$$

$$Eg(q) < Eg(h) < Eg(m) \quad \text{Relationship (C)}$$

In the relationships, $Ip(h)$ represents the absolute value of the ionization potential of the first protective material, $Ip(m)$ represents the absolute value of the ionization potential of the organic compound contained in the matrix material, $Ea(h)$ represents the absolute value of the electronic affinity of the first protective material, $Ea(m)$ represents the absolute value of the electronic affinity of the organic compound, $Eg(h)$ represents the bandgap of the first protective material, $Eg(m)$ represents the bandgap of the organic compound, and $Eg(q)$ represents the bandgap of the quantum dot.

Furthermore, when the first protective material has at least one remaining hydrophilic group and a hydrophobic group in one molecule, specific examples of the combination of the hydrophobic group of the protective material/organic compound/quantum dot include:

(1) remaining group of 3-(2-benzo thiazoleyl)-7-(diethylamino) coumalin/4,4'-bis(carbazole-9-yl)biphenyl/CdSe/ZnS (luminous wavelength: 620 nm);

(2) remaining group of 5,6,11,12-tetraphenyl naphthacene/4,4'-bis(carbazole-9-yl)biphenyl/CdSe/Zns (luminous wavelength: 620 nm); and (3) remaining group of 2,5,8,11-tetra-tert-butyl perylene/4,4'-bis(carbazole-9-yl-biphenyl/CdSe/ZnS (luminous wavelength: 520 nm).

However, even with these structures the luminance efficiency remains insufficient.

SUMMARY OF THE INVENTION

In view of the foregoing, the present invention provides a novel light emitting device having a substrate and a luminous layer provided overlying the substrate. The luminous layer is a semiconductor nanocrystal to which a carbazole derivative is coordination-bonded or attached. The carbazole derivative has aromatic rings of a compound represented by the following chemical structure 1. The aromatic rings have one to three substitution groups represented by the following chemical structure 2:

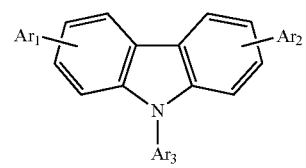

Chemical Structure 1 where $Ar_1$ and $Ar_2$ independently represent substituted or non-substituted aryl groups that may share a linkage to form a ring with a benzene ring, heterocyclic groups, and hydrogen atoms and $Ar_3$ represents a substituted or non-substituted aryl group, and -X-Y-Z     Chemical Structure 2 where X represents a methylene group, a carbonyloxy group, an oxycarbonyl group, a carbonyl group, an oxygen atom, or a sulfur atom, Y represents a substituted or non-substituted alkylene group, and Z represents a carboxyl group, a hydroxyl group, or a thiol group.

It is preferred that, in the light emitting device described above, the carbazole derivative is represented by the following chemical structure 3:

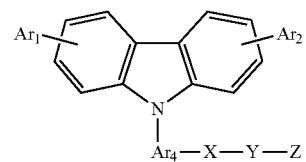

Chemical Structure 3 where $Ar_4$ represents a substituted or non-substituted arylene group.

It is still further preferred that, in the light emitting device described above, $Ar_1$ and $Ar_2$ independently represent groups represented by the following chemical structure 4:

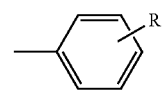

Chemical Structure 4 where R represents a hydrogen atom, a substituted or non-substituted alkyl group, a substituted or non-substituted alkoxy group, a halogen atom, or a substituted or non-substituted aryl group.

It is still further preferred that, in the light emitting device described above, the compound represented by the chemical structure 3 is a benzocarbazole derivative represented by the following chemical structure 5:

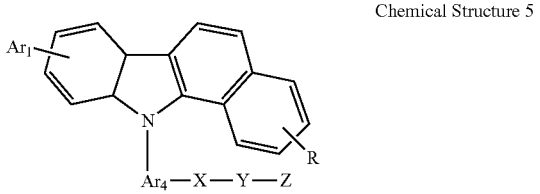

Chemical Structure 5 where R represents a hydrogen atom, a substituted or non-substituted alkyl group, a substituted or non-substituted alkoxy group, a halogen atom, or a substituted or non-substituted aryl group.

It is still further preferred that, in the light emitting device described above, the carbazol derivative is represented by the following chemical structure 6:

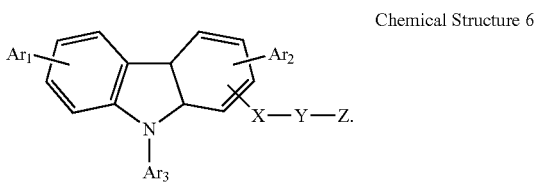

Chemical Structure 6

As another aspect of the present invention, a display unit is provided which include the light emitting device described above.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

DETAILED DESCRIPTION OF THE INVENTION

Figure 1:
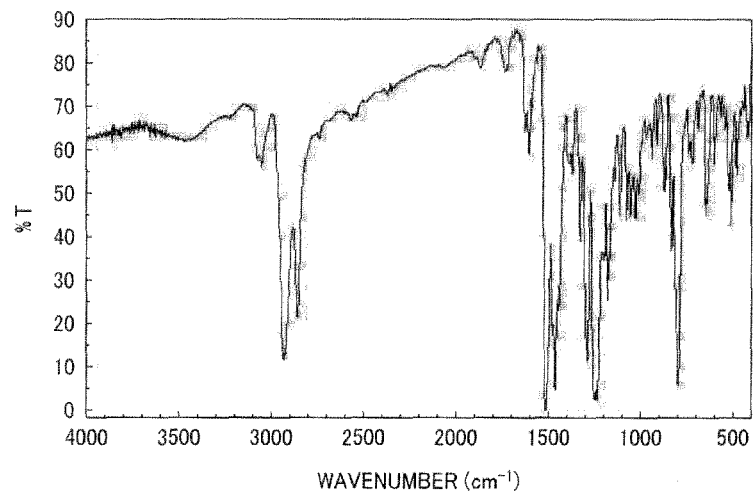
FIG. 1 is a graph illustrating the infra red spectrum of carbazole derivative 1 described later.

Embodiments of the present disclosure are described with reference to accompanying drawings.

The light emitting device of the present disclosure has a substrate and a luminous layer provided overlying the substrate and containing a semiconductor nanocrystal. A carbazole derivative is coordination-bonded or attached to the semiconductor nanocrystal. In the carbazole derivative, the aromatic rings in the compound represented by the following chemical structure 1 have one to three substitution groups represented by the following chemical structure 2.

(1)

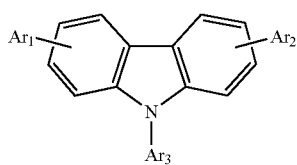

Chemical structure 1

In the chemical structure 1, $Ar_1$ and $Ar_2$ independently represent substituted or non-substituted aryl groups that may share a linkage to form a ring with a benzene ring, heterocyclic groups, and hydrogen atoms and $Ar_3$ represents a substituted or non-substituted aryl group.

-X-Y-Z    Chemical structure 2

In the chemical structure 2, X represents a methylene group, a carbonyloxy group, an oxycarbonyl group, a carbonyl group, an oxygen atom, or a sulfur atom, Y represents a substituted or non-substituted alkylene group, and Z represents a carboxyl group, a hydroxyl group, or a thiol group. When the aromatic rings in the compound represented by the chemical structure 1 are substituted by two or three groups represented by the chemical structure 2, the two or three substitution groups may or may not be identical.

In the chemical structure 1, there is no specific limit to the selection of the non-substituted aryl group for $Ar_1$, $Ar_2$, and $Ar_3$. Specific examples thereof include, but are not limited to, a phenyl group, a naphtyl group, a biphenyl group, a terphenyl group, a pyrenyl group, a fluorenyl group, a 9,9-dimethyl-2-fluorenyl group, an azulenyl group, an anthryl group, a triphenylenyl group, a crycenyl group, a fluorenylidene phenyl group, and a 5H-dibenzo[a,d]cycloheptenylidene phenyl group.

In the chemical structure 1, there is no specific limit to the selection of the non-substituted heterocyclic group of $Ar_1$ and $Ar_2$. Specific examples thereof include, but are not limited to, a furyl group, a benzofuranyl group, a carbazolyl group, a pyridyl group, a pyrrolidyl group, a thiophenyl group, a methylthiophenyl group, and an oxazolyl group.

In addition, each of the non-substituted aryl group and the non-substituted heterocylic group optionally has a straight chain, branch chain, or cyclic alkyl group having 1 to 25 carbon atoms such as a methyl group, an ethyl group, an n-propyl group, an isoprpyl group, an n-butyl group, an isobutyl group, an s-butyl group, a t-butyl group, a pentyl group, a hexyl group, a heptyl group, an octyl group, a nonyl group, a decyl group, a 3,7-dimethyl octyl group, a 2-ethylhexyl group, a trifluoromethyl group, a 2-cyano ethyl group, a benzyl group, a 4-chlorobenzyl group, a 4-methyl benzyl group, a cyclopentyl group, and a cyclohexyl group.

In addition, there is no specific limit to the selection of the substitution group for the aryl group for $Ar_1$, $Ar_2$, and $Ar_3$. Specific examples thereof include, but are not limited to, a straight chain, branch chain, or cyclic substituted or non-substituted alkoxy group having 1 to 25 carbon atoms, a halogen atom such as a fluorine atom, a chlorine atom, and a bromine atom, a cyano group, a triphenyl silyl group, a furyl group, a benzofuranyl group, a carbazolyl group, a pyridyl group, a pyrrolidyl group, a thiophenyl group, a methylthiophenyl group, and an oxazolyl group. There is no specific limit to the selection of the substitution group for the alkoxy group. Specific examples thereof include, but are not limited to, a fluorine atom, a cyano group, and a substituted or non-substituted phenyl group. There is no specific limit to the selection of the substitution group for the phenyl group. Specific examples thereof include, but are not limited to, a halogen atom such as a fluorine atom, a chlorine atom, and a bromine atom and a straight-chained or cyclic alkyl group.

Specific examples of the substituted or non-substituted alkoxy groups include, but are not limited to, a methoxy group, an ethoxy group, an n-propoxy group, an isopropopxy group, an n-buthoxy group, an isobuthoxy group, an s-buthoxy group, a t-buthoxy group, a pentyloxy group, a hexyloxy group, a heptyloxy group, an octyloxy group, a nonyloxy group, a decyloxy group, a 3,7,-dimethyl octyloxy group, a 2-ethylhexyloxy group, a trifluoromethoxy group, a 2-cyanoethoxy group, a benzyloxy group, a 4-chlorobenzyloxy group, a 4-methylbenzyloxy group, a cyclopentyloxy group, and a cyclohexyloxy group.

The number of carbon atoms in the aryl group and the heterocyclic group are from 6 to 30 and from 4 to 28, respectively.

Specific examples of the compound represented by the chemical structure 1 in which $Ar_1$ and/or $Ar_2$ are an aryl group(s) that shares a linkage to form a ring with the benzene ring include, but are not limited to, a derivative of benzocarbazole and a derivative of dibenzocarbazole.

In the chemical structure 2, the non-substituted alkylene group in Y preferably has 1 to 25 carbon atoms. There is no specific limit to the selection of the non-substituted alkylene group. Specific examples thereof include, but are not limited to, a methylene group, an ethylene group, a trimethylene group, a tetramethylene group, a pentamethylene group, a hexamethylene group, a heptamethylene group, an octamethylene group, a nonamethylene group, a decamethylene group, a undecamethylene group, dodecamethylene group, a tridecamethylene group, a tetradecamethylene group, a pentadecamethylene group, a hexadecamethylene group, a heptadecamethylene group, an octadecamethylene group, a nonadecamethylene group, an icosamethylene group, a henicosa methylene, a docosamethylene group, a tricosamethylene group, a tetracosamethylene group, and a pentacosamethylene group.

In addition, there is no specific limit to the selection of the substitution groups of the alkylene group in Y. Specific examples thereof include, but are not limited to, a halogen atom such as a fluorine atom, a chlorine atom, and a bromine atom and a straight chained, branch-chained, or cyclic alkyl group having 1 to 24 carbon atoms.

In the present disclosure, there is no specific limit to the selection of the carbazole derivative. Specific examples thereof include, but are not limited to, the following compounds:

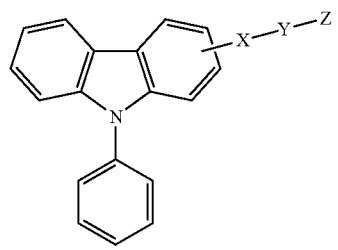

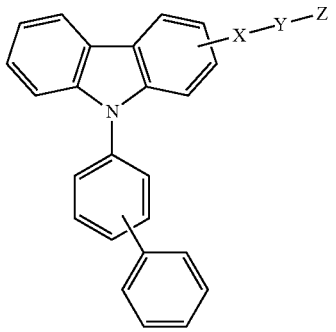

-continued

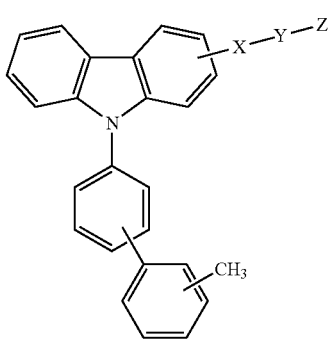

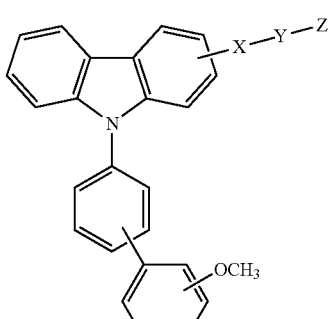

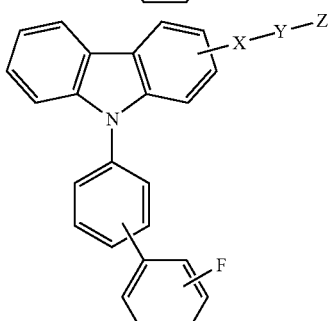

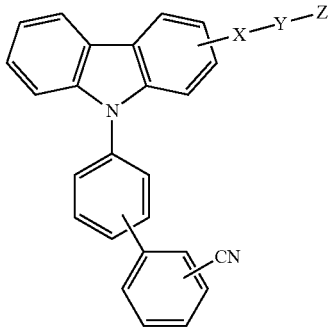

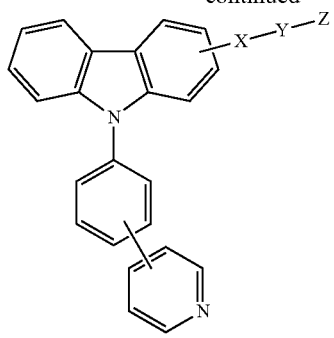
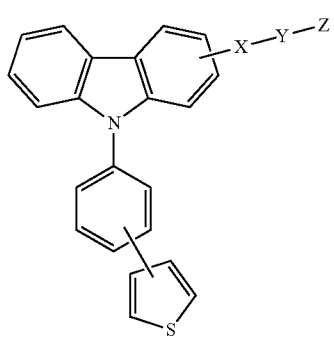
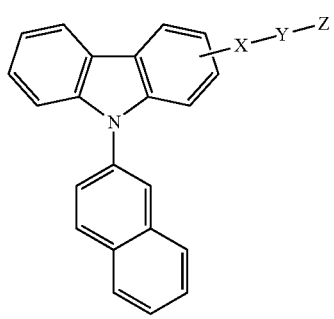
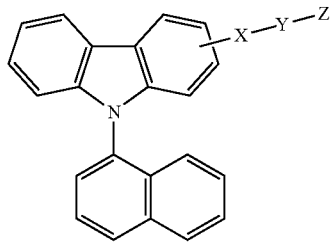
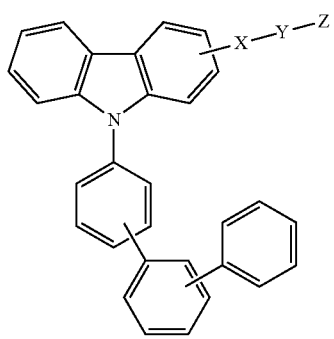
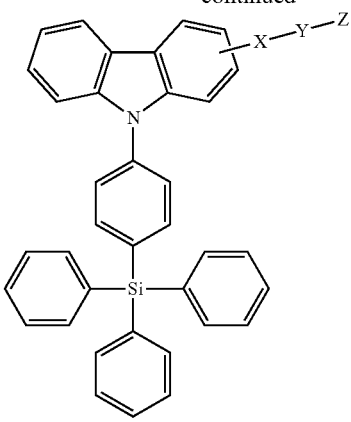
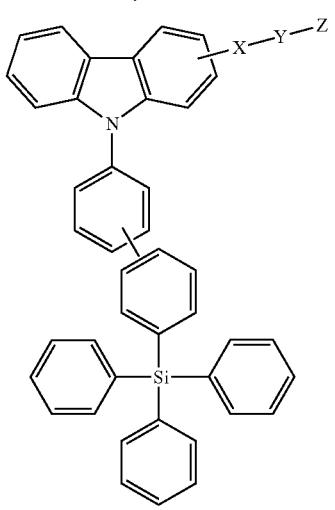
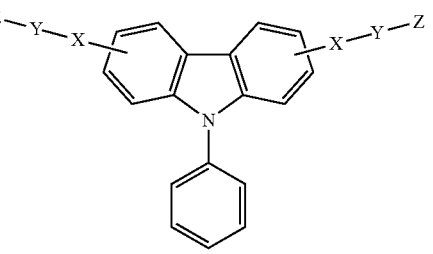
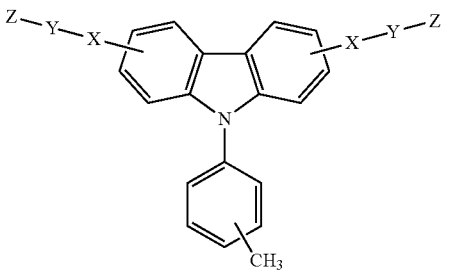
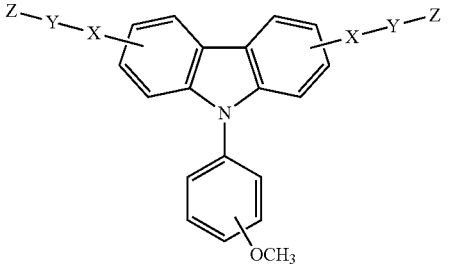

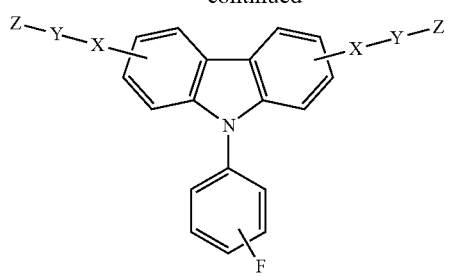
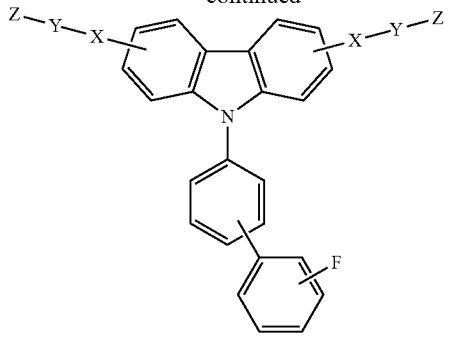
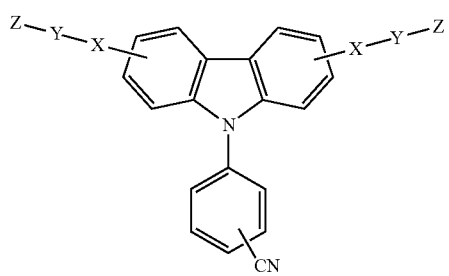
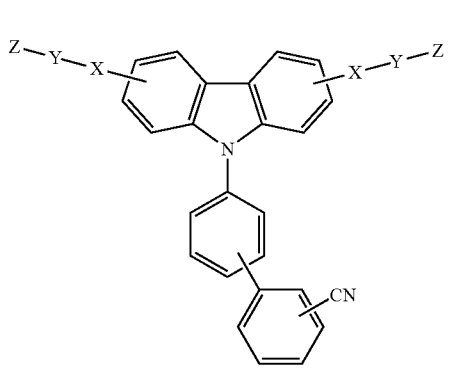
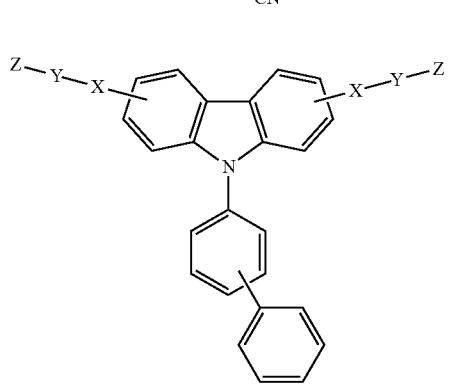
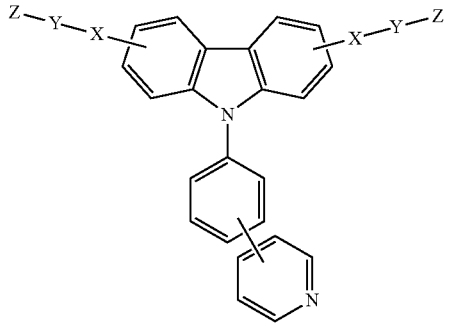
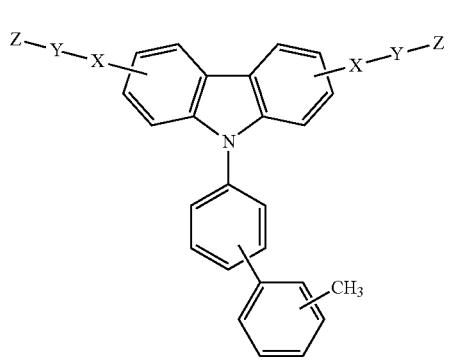
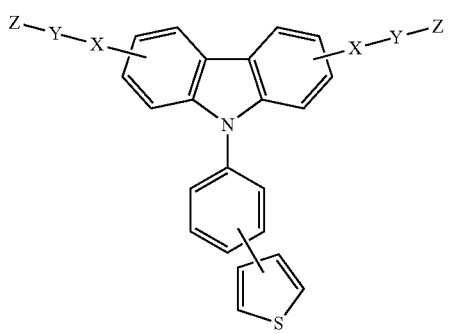
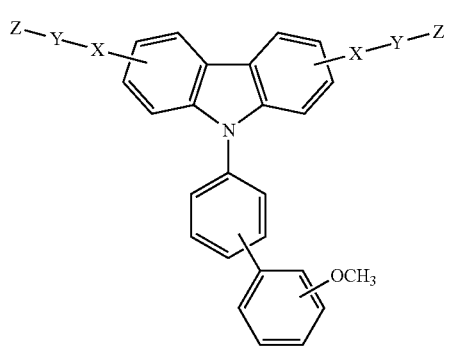
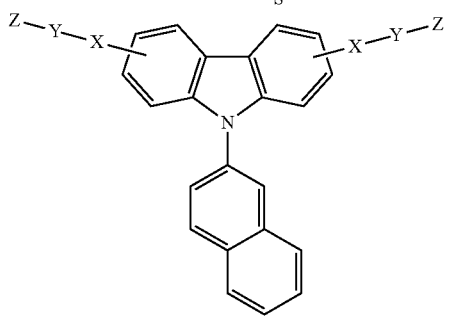

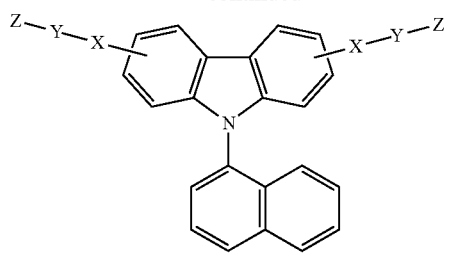
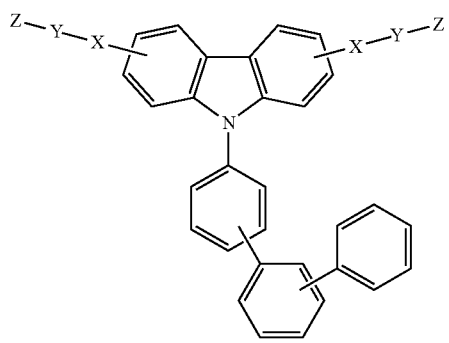
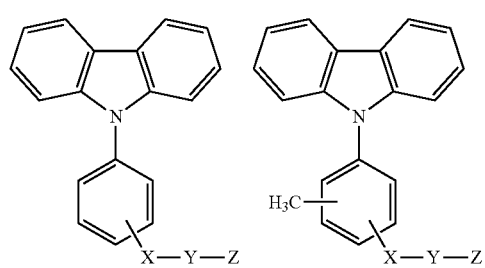
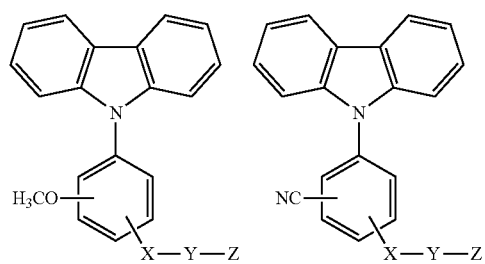
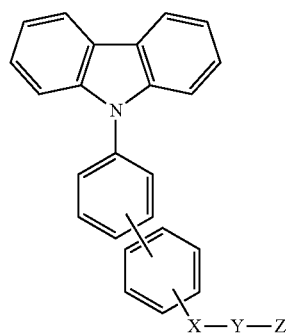
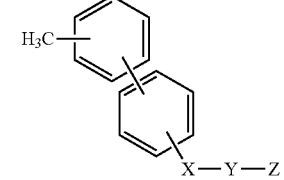
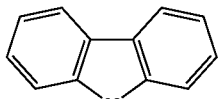
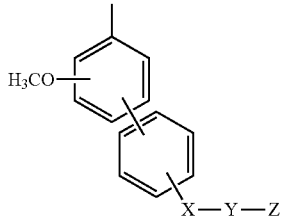
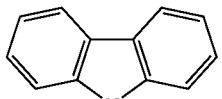
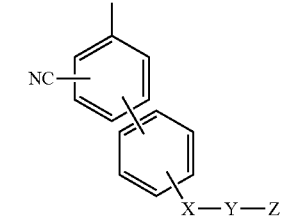
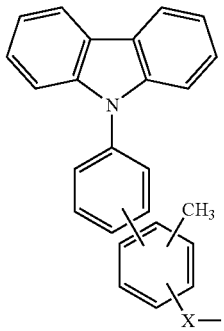
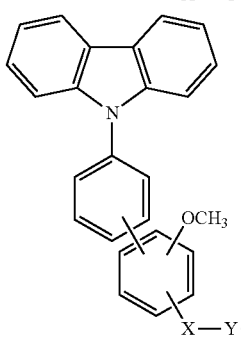

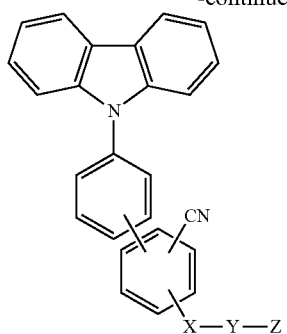
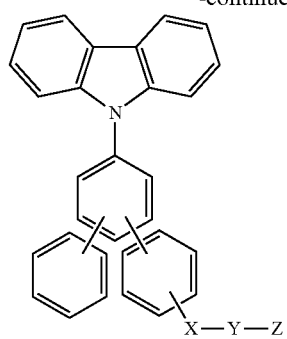
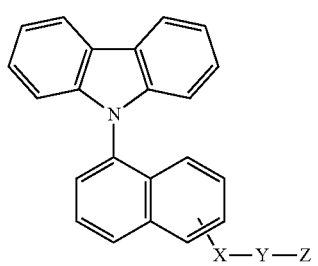
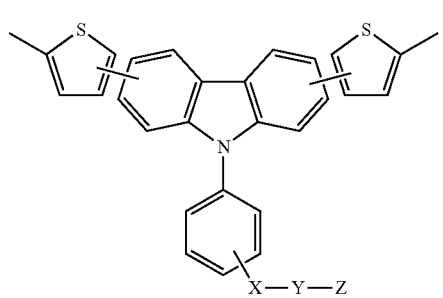
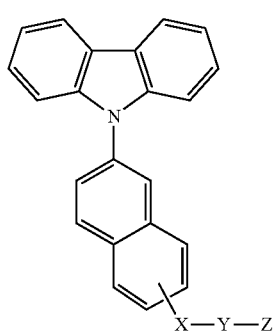
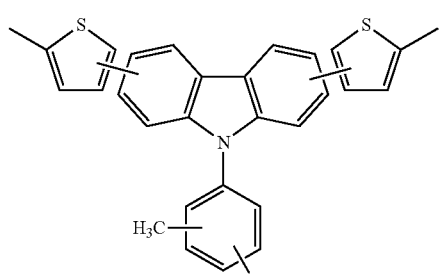
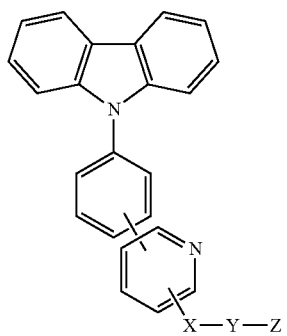
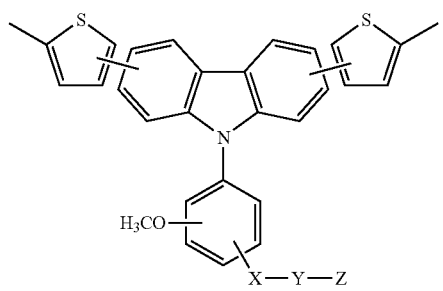
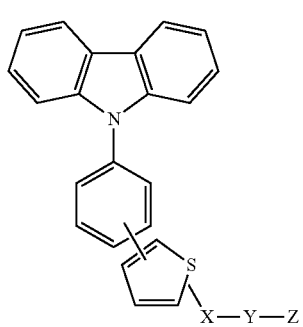
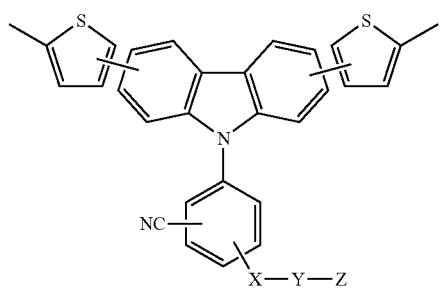

-continued
17
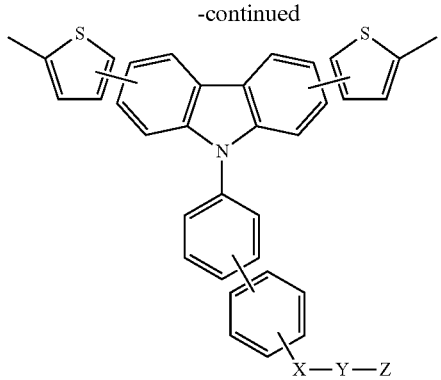
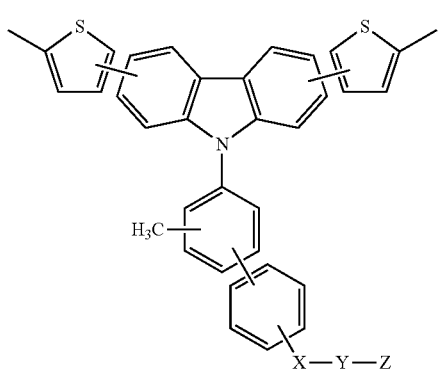
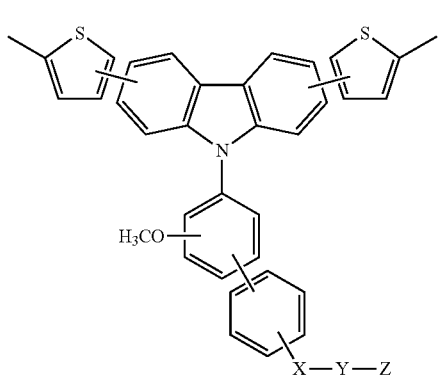
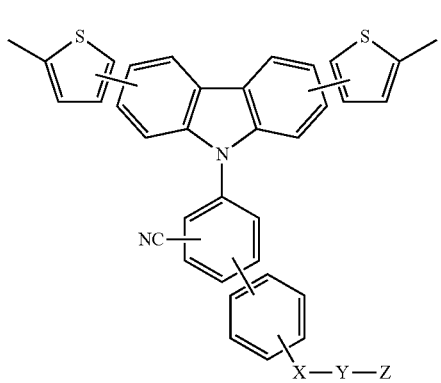
18
-continued
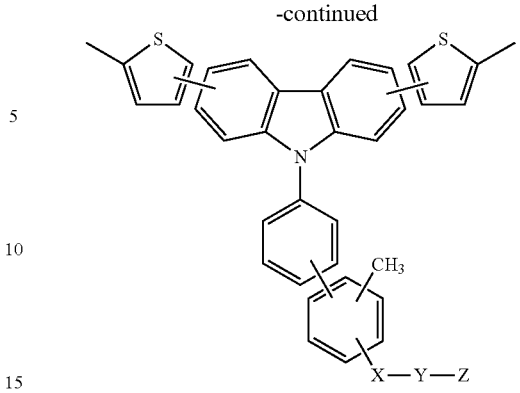
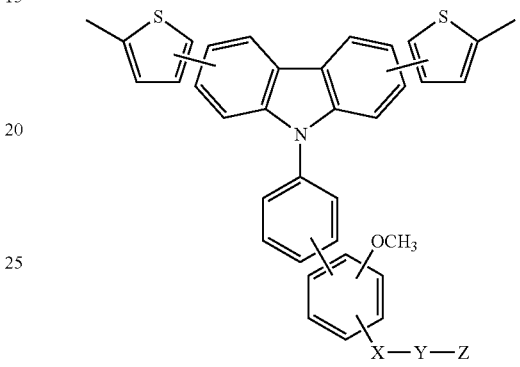
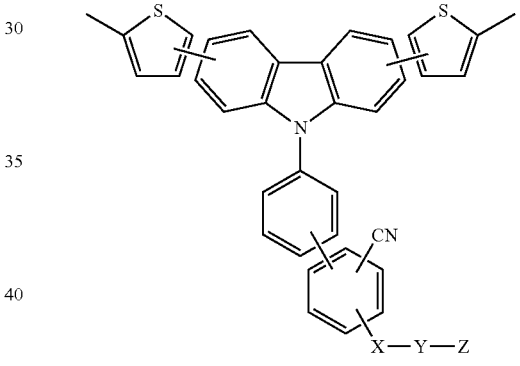
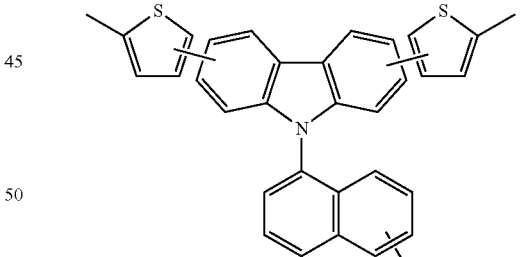
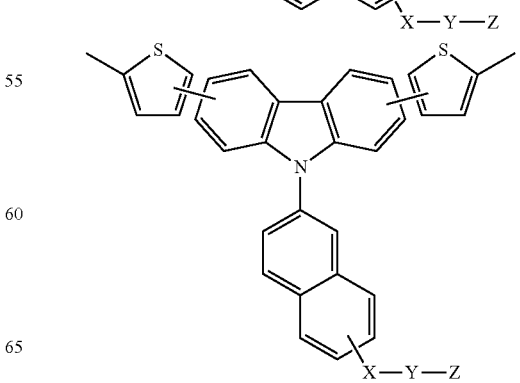

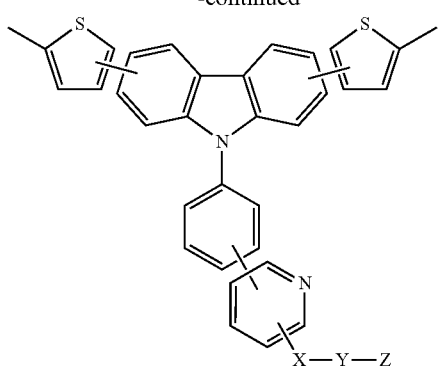
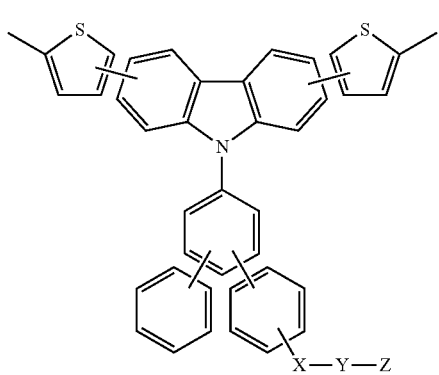
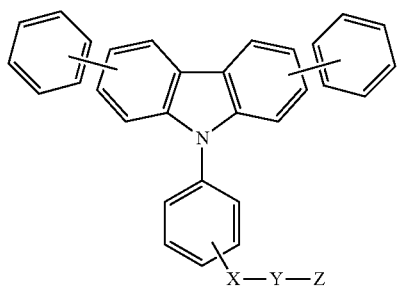
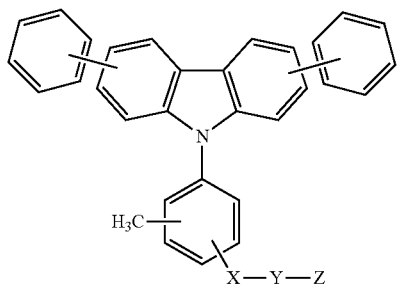
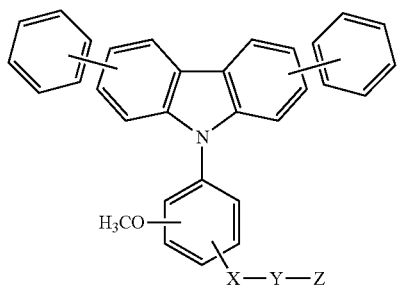
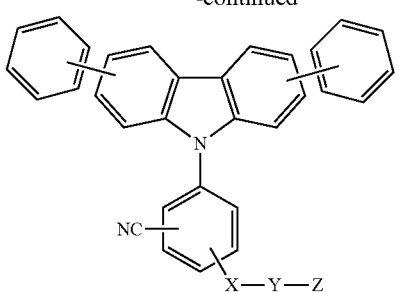
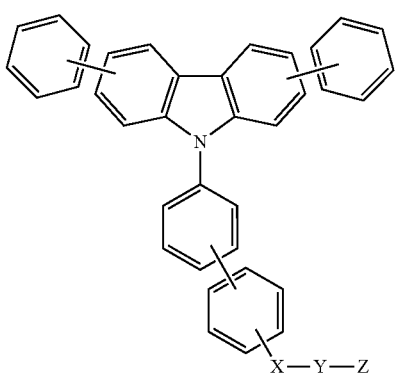
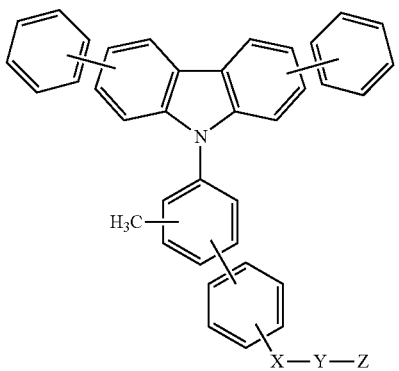
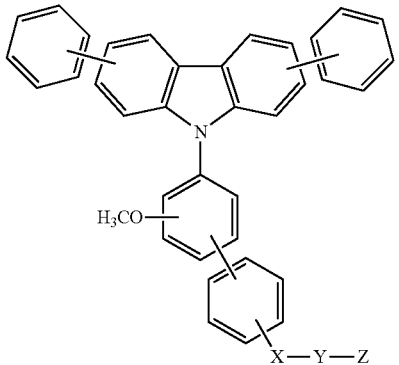

-continued
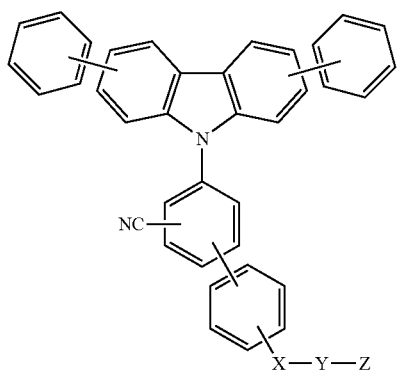
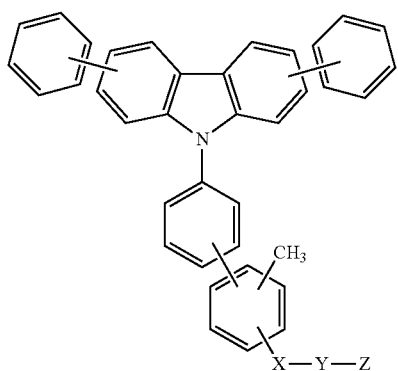
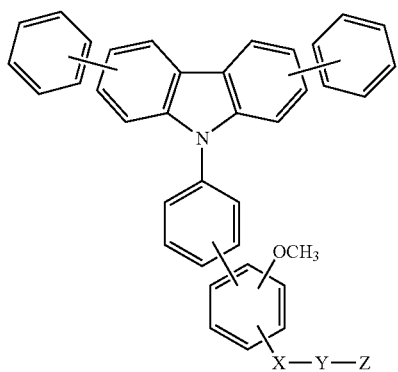
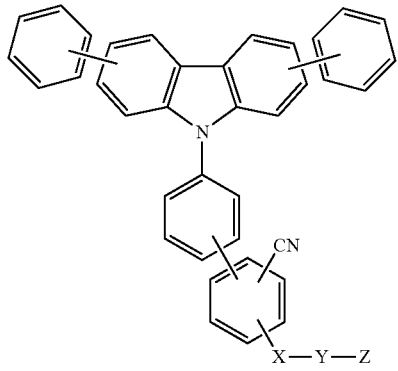
-continued
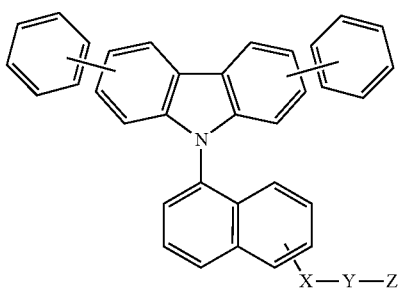
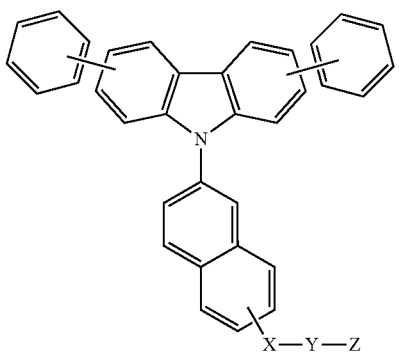
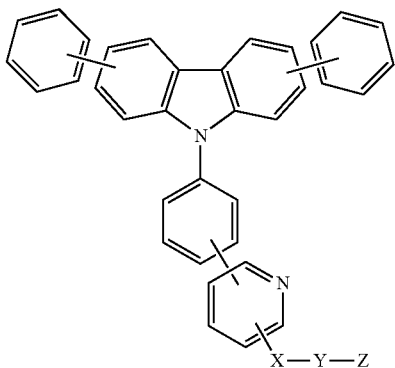
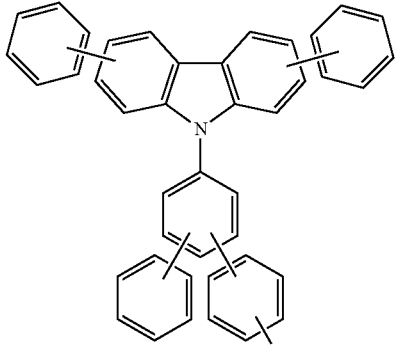
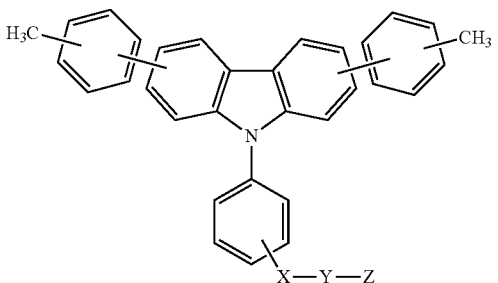

-continued
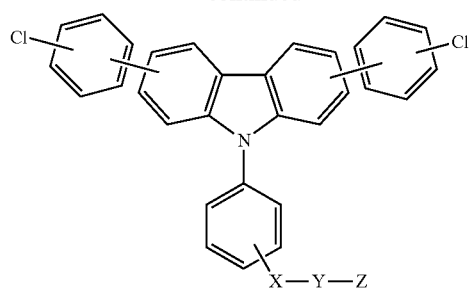
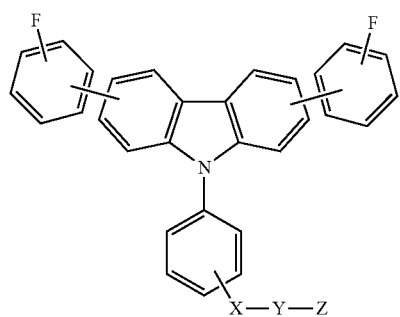
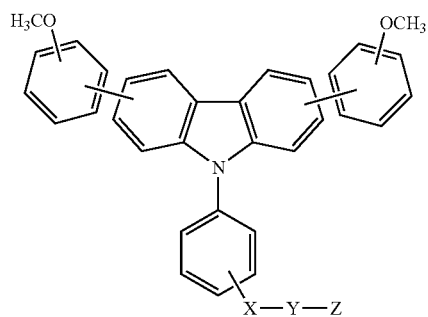
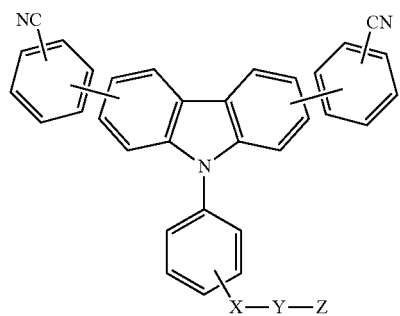
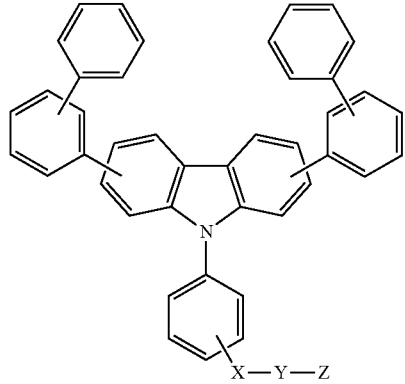
-continued
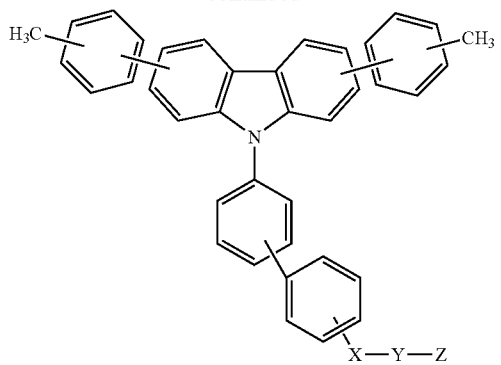
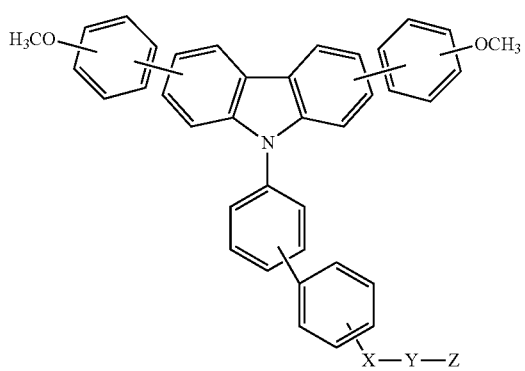
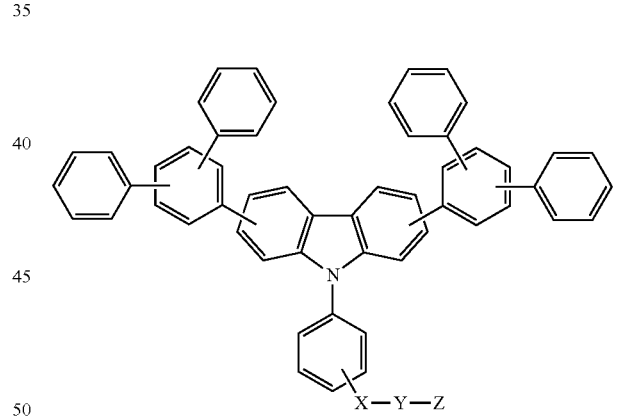
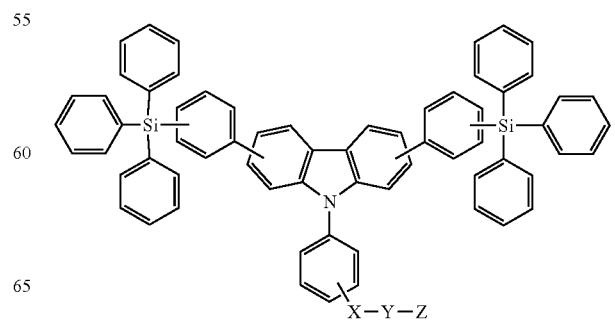

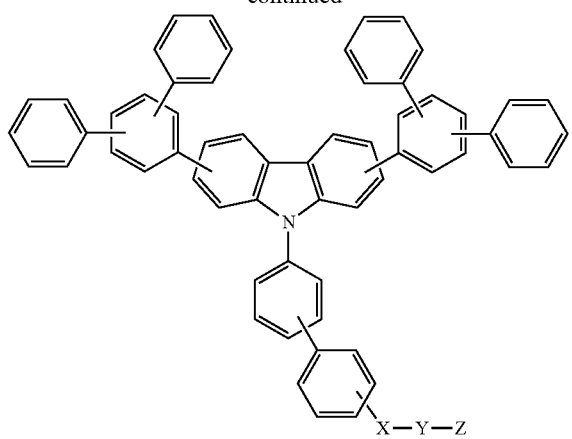
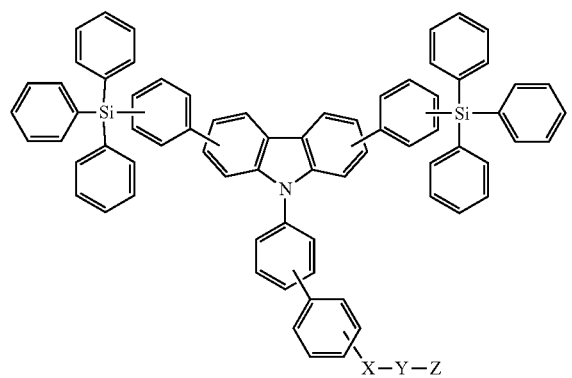
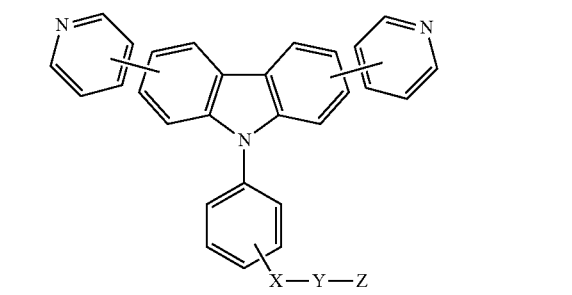
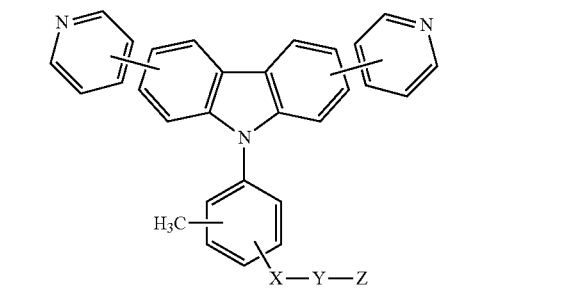
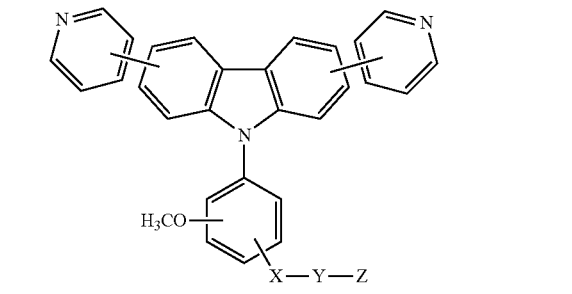
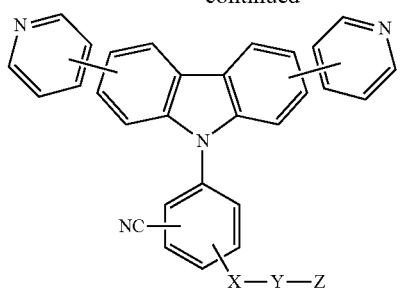
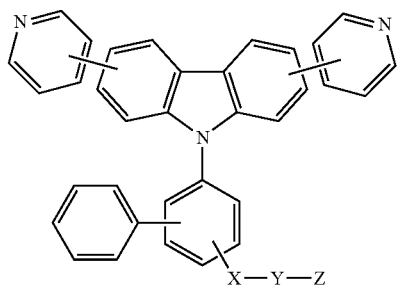
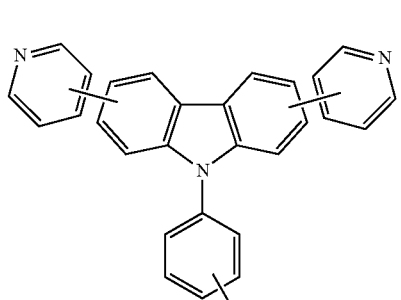
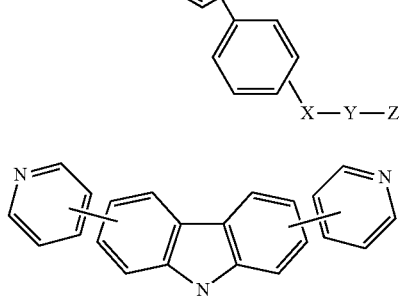
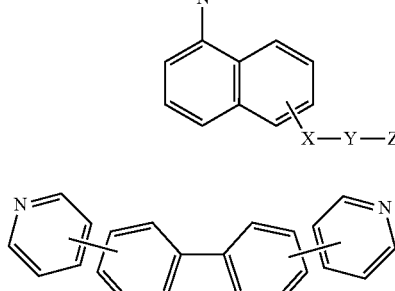
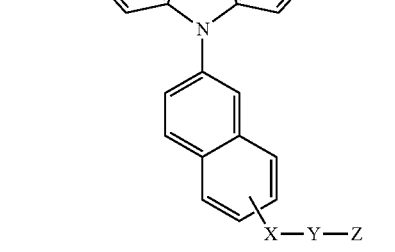

-continued

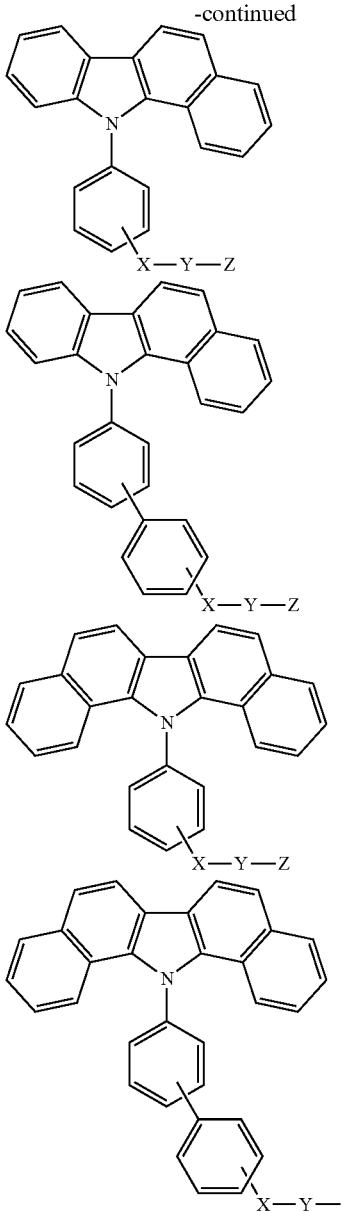

There is no specific limit to the selection of the group represented by the chemical structure 2. Specific examples thereof include, but are not limited to, the following:

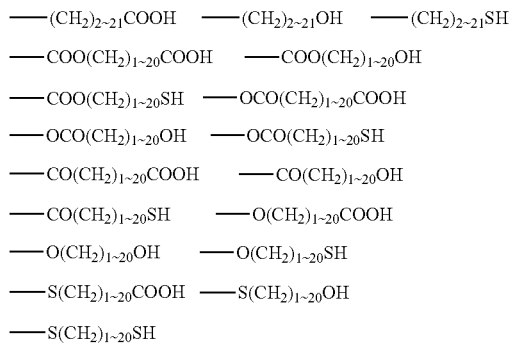

-continued

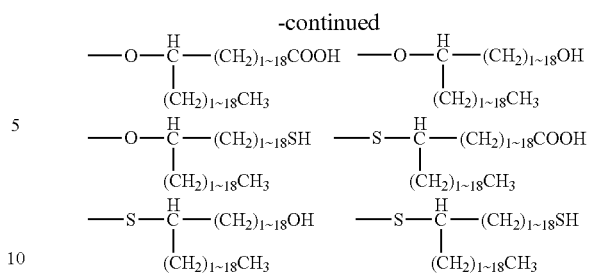

In the present disclosure, the carbazole derivative is preferably the compound represented by the chemical structure 3 or 6. $Ar_4$ represents an arylene group deriving from $Ar_3$.

Chemical Structure 3

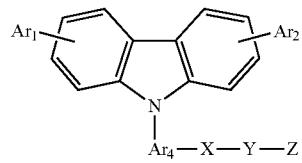

In the chemical structure 3, $Ar_4$ represents a substituted or non-substituted arylene group.

Chemical Structure 6

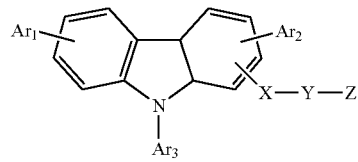

In the chemical structure 3, $Ar_1$ and $Ar_2$ independently represent a group represented by the chemical structure 4.

Chemical Structure 4

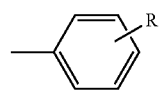

In the chemical structure 4, R represents a hydrogen atom, a substituted or non-substituted alkyl group, a substituted or non-substituted alkoxy group, a halogen atom, or a substituted or non-substituted aryl group.

The compound represented by the chemical structure 3 is preferably a benzocarbazole derivative represented by the chemical structure 5.

Chemical Structure 5

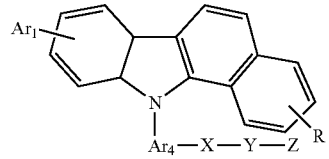

In the chemical structure 5, R represents a hydrogen atom, a substituted or non-substituted alkyl group, a substituted or non-substituted alkoxy group, a halogen atom, or a substituted or non-substituted aryl group.

In the chemical structures 4 and 5, the non-substituted alkyl group in the R is preferably a straight-chained, a branch-chained, or cyclic alkyl group having 1 to 25 carbon atoms and the non-substituted alkoxy group in the R is preferably a straight-chained, a branch-chained, or cyclic alkoxy group having 1 to 25 carbon atoms. There is no specific limit to the selection of the substitution group for the alkyl group and the alkoxy group. Specific examples thereof include, but are not limited to, a fluorine atom, a cyano group, and a substituted or non-substituted phenyl group. There is no specific limit to the selection of the substitution group for the phenyl group. Specific examples thereof include, but are not limited to, a halogen atom such as a fluorine atom, a chlorine atom, and a bromine atom and a straight-chained or cyclic alkyl group.

Specific examples of the substituted or non-substituted alkyl group include, but are not limited to, a methyl group, an ethyl group, an n-propyl group, an isopropyl group, an n-butyl group, an isobutyl group, an s-butyl group, a t-butyl group, a pentyl group, a hexyl group, a heptyl group, an octyl group, a nonyl group, a decyl group, a 3,7-dimethyl octyl group, a 2-ethylhexyl group, a trifluoromethyl group, a 2-cyanoethyl group, a benzyl group, a 4-chlorobenzyl group, a 4-methylbenzyl group, a cyclopentyl group, and a cyclohexyl group.

Specific examples of the substituted or non-substituted alkoxy groups include, but are not limited to, a methoxy group, an ethoxy group, an n-propoxy group, an isopropoxy group, an n-buthoxy group, an isobuthoxy group, an s-buthoxy group, a t-buthoxy group, a pentyloxy group, a hexyloxy group, a heptyloxy group, an octyloxy group, a nonyloxy group, a decyloxy group, a 3,7,-dimethyl octyloxy group, a 2-ethylhexyloxy group, a trifluoromethoxy group, a 2-cyanoethoxy group, a benzyloxy group, a 4-chlorobenzyloxy group, a 4-methylbenzyloxy group, a cyclopentyloxy group, and a cyclohexyloxy group.

There is no specific limit to the selection of the halogen atom in the R. Specific examples thereof include, but are not limited to, a fluorine atom, a chlorine atom, and a bromine atom.

The aryl group in the R is the same as those for $Ar_1$, $Ar_2$, and $Ar_3$.

Synthesis Example 1 of Compound Represented by Chemical Structure 3

The compound represented by the chemical structure 3 can be synthesized as follows.

Chemical Reaction Formula 1

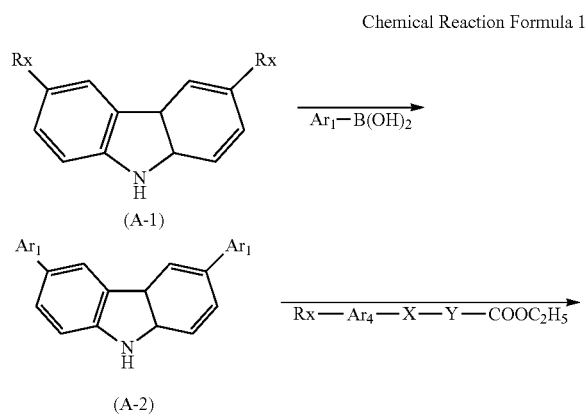

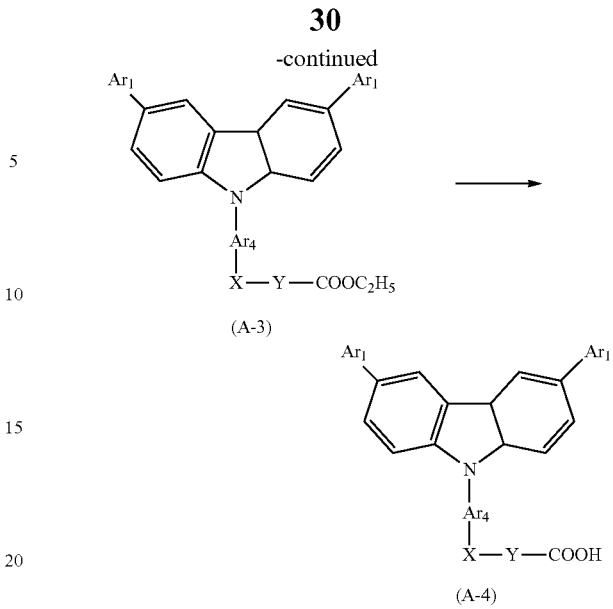

In the chemical reaction formula 1, Rx represents a halogen atom.

First, using a palladium catalyst, a carbazole derivative (A-2) is obtained in Suzuki-Miyaura Cross-coupling reaction between an organic halogen compound (A-1) and an aryl boronic acid $Ar_1$—$B(OH)_2$.

There is no specific limit to the selection of the palladium catalyst. Specific examples thereof include, but are not limited to, $Pd(PPh_3)_4$, $PdCl_2(PPh_3)_2$, $Pd(OAc)_2$, and $PdCl_2$. Among them, $Pd(PPh_3)_4$ is most commonly used.

An aryl boronic acid ester synthesized from bis(pinacolato)diboronium, which is thermally stable and easily handled in the air and a halogenated aryl can be used instead of aryl boronic acid.

In addition, Rx in the organic halogenated compound (A-1) is preferably an iodine atom or a bromine atom in terms of reactivity.

Suzuki-Miyaura cross coupling reaction requires a base and preferably a relatively weak base such as $Na_2CO_3$ and $NaHCO_3$. In addition, considering the impact of steric barrier, a strong base such as $Ba(OH)_2$ and $K_3PO_4$ is preferable. Specific examples of the other bases include, but are not limited to, sodium hydroxide, potassium hydroxide, and a metal alkoxide such as potassium t-butoxide, sodium t-butoxide, lithium t-butoxide, potassium 2-methyl-2-butoxide, sodium 2-methyl-2-butoxide, sodium methoxide, sodium ethoxide, potassium ethoxide, and potassium methoxide. In addition, an organic base such as triethyl amine can be used as the base.

Specific examples of the reaction solvent include, but are not limited to, alcohol- or ether-based solvents such as methanol, ethanol, isopropanol, butanol, 2-methoxyethanol, 1,2-dimethoxyethane, bis(2-methoxyethyl)ether, cyclic ether solvents such as dioxane and tetrahydrofuran, benzene, toluene, xylene, dimethylsulfoxide, N,N-dimethylformamide, N-methylpyrrolidone, and 1,3-dimethyl-2-imidazolidinone.

Next, using a palladium catalyst and a phosphine coordinate, a carbazole derivative (A-3) is obtained by conducting Ullmann reaction or Buchwald-Hartwig amination reaction of the carbazole derivative (A-2) with a halogenated aryl Rx—$Ar_4$—X—Y—$COOC_2H_5$.

There is no specific limit to the selection of the palladium catalyst. Specific examples thereof include, but are not limited to, $Pd_2(dba)_3$ and $Pd(OAc)_2$.

There is no specific limit to the selection of the phosphine coordinate. Specific examples thereof include, but are not limited to, 2,2'-bis(diphenylphosphino)-1,1'-binaphthyl, pentaphenyl(di-t-butylphosphino)ferrocene, bis(1-adamantyl)-n-butylphosphine, bis(1-adamantyl)-n-butylphosphonium iodide, and bis(1-adamantyl)benzyl phosphine.

Rx in the halogenated aryl is preferably a bromine atom or a chlorine atom in terms of reactivity.

Ullmann reaction or Buchwald-Hartwig amination reaction requires a base and a relatively weak base such as $K_2CO_3$, $Cs_2CO_3$, $Na_2CO_3$, and $NAHCO_3$ can be used.

Furthermore, using a base such as sodium hydroxide, a carbazole derivative (A-4) is obtained by hydrolyzing the carbazole derivative (A-3).

Synthesis Example 2 of Compound Represented by Chemical Structure 3

The compound represented by the chemical structure 3 can be synthesized as follows.

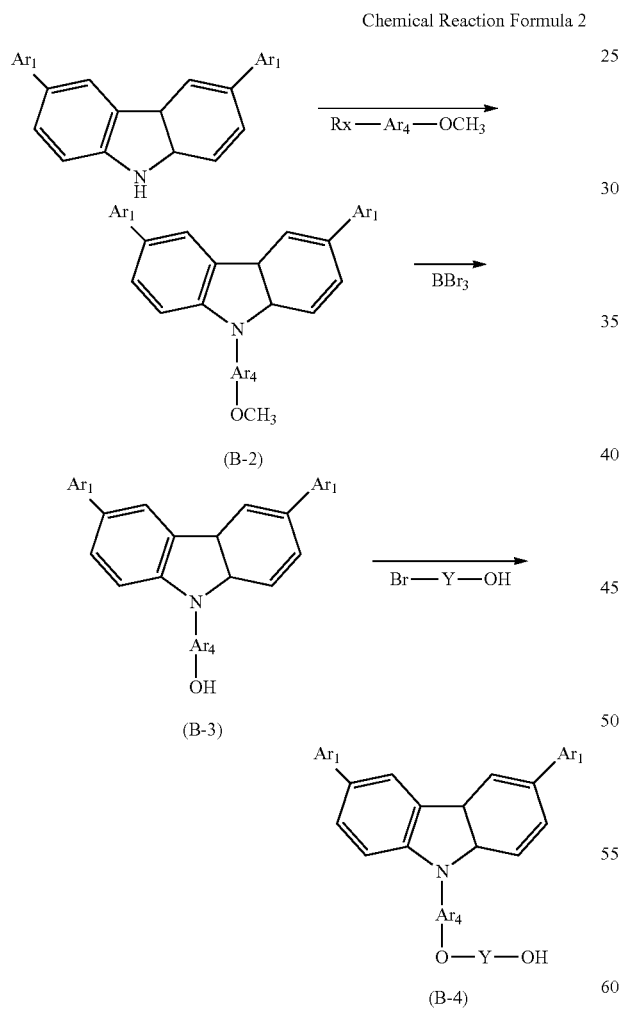

Chemical Reaction Formula 2

In the chemical reaction formula 2, Rx represents a halogen atom.

First, a carbazole derivative (B-2) is obtained by conducting Ullmann reaction or Buchwald-Hartwig amination reaction of a carbazole derivative (B-1) with a halogenated aryl Rx—Ar$_4$—OCH$_3$. The carbazole derivative (B-1) is identical to the carbazole derivative (A-2).

Next, using boron tribromide, a carbazole derivative (B-3) is obtained by demethylating the carbazole derivative (B-2).

Furthermore, a carbazole derivative (B-4) is obtained by etherifying the carbazole derivative (B-3) with bromo alcohol Br—Y—OH.

Synthesis Example 3 of Compound Represented by Chemical Structure 3

The compound represented by the chemical structure 3 can be synthesized as follows.

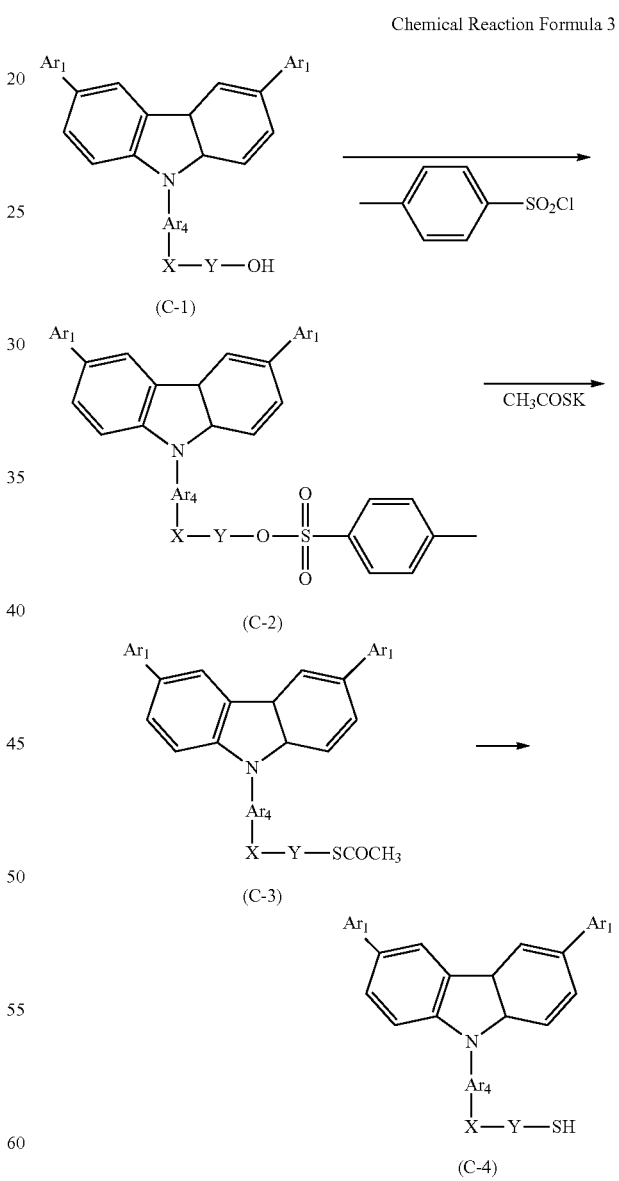

Chemical Reaction Formula 3

First, using chlorinated p-toluene sulphonyl under the presence of a base such as pyridine, a carbazole derivative (C-2) is obtained by tosylating the hydroxyl group of a carbazole derivative (C-1).

Next, using potassium thioacetate, a carbazole derivative (C-3) is obtained by thioacetylating the carbazole derivative (C-2).

Furthermore, using a base such as sodium hydroxide, a carbazole derivative (C-4) is obtained by hydrolyzing the carbazole derivative (C-3).

Synthesis Example 4 of Compound Represented by Chemical Structure 3

The compound represented by the chemical structure 5 can be synthesized as follows.

Chemical Reaction Formula 4

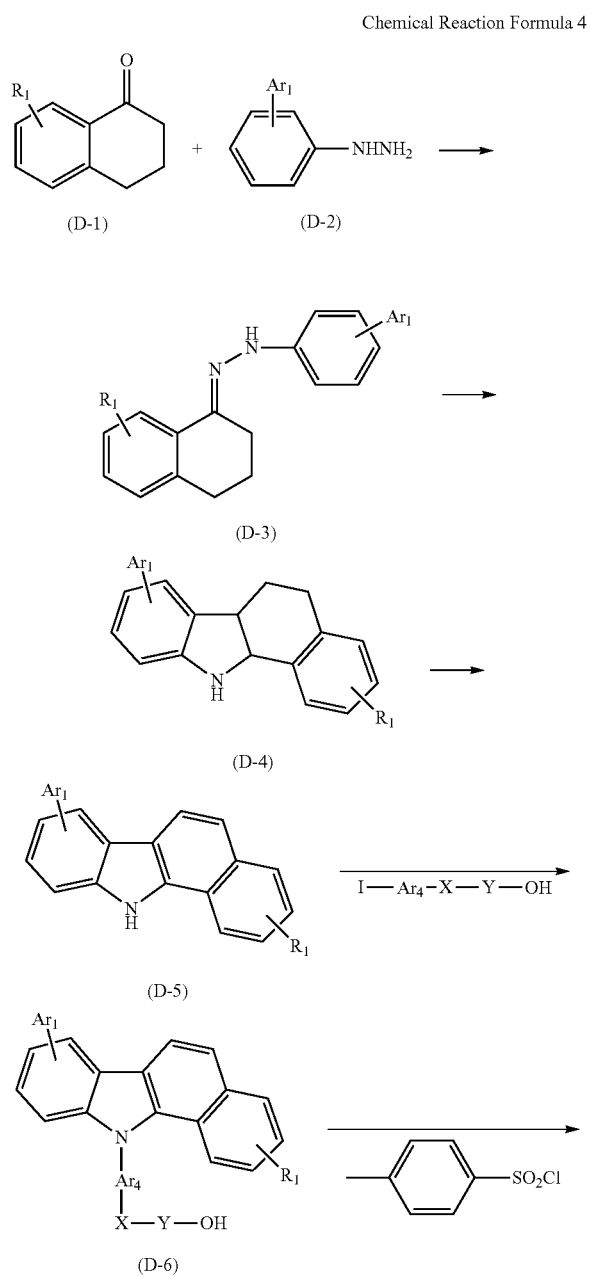

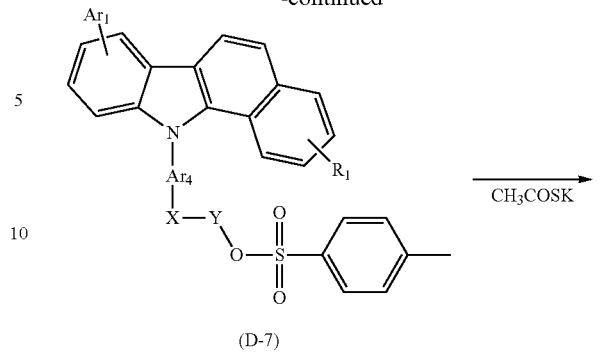

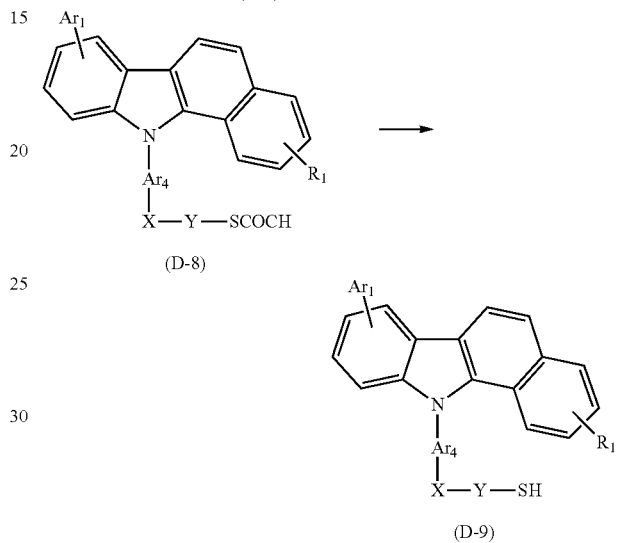

First, under the presence of protic acid, a hydrazone compound (D-3) is obtained in the reaction between a tetranone compound (D-1) and a phenyl hydrazine compound (D-2).

Next, under the presence of a Lewis acid such as $ZnCl_2$, a cyclic compound (D-4) is obtained by cyclizing the hydrazone compound (D-3).

Furthermore, using a catalyst such as Pd/C, a benzocarbazole derivative (D-5) is obtained by oxydizing the cyclic compound (D-4).

Next, a benzocarbazole derivative (D-6) is obtained by conducting Ullmann reaction or Buchwald-Hartwig amination reaction of the benzocarbazole derivative (D-5) with an iodized aryl I—Ar$_4$—X—Y—OH.

Furthermore, using chlorinated p-toluene sulphonyl under the presence of a base such as pyridine, a benzocarbazole derivative (D-7) is obtained by tosylating the hydroxyl group of the benzocarbazole derivative (D-6).

Next, using potassium thioacetate, a benzocarbazole derivative (D-8) is obtained by thioacetylating the benzocarbazole derivative (D-7).

Furthermore, using a base such as sodium hydroxide, a benzocarbazole derivative (D-9) is obtained by hydrolyzing the carbazole derivative (D-8).

Synthesis Example 1 of Compound Represented by Chemical Structure 6

The compound represented by the chemical structure 6 can be synthesized as follows.

Chemical Reaction Formula 5

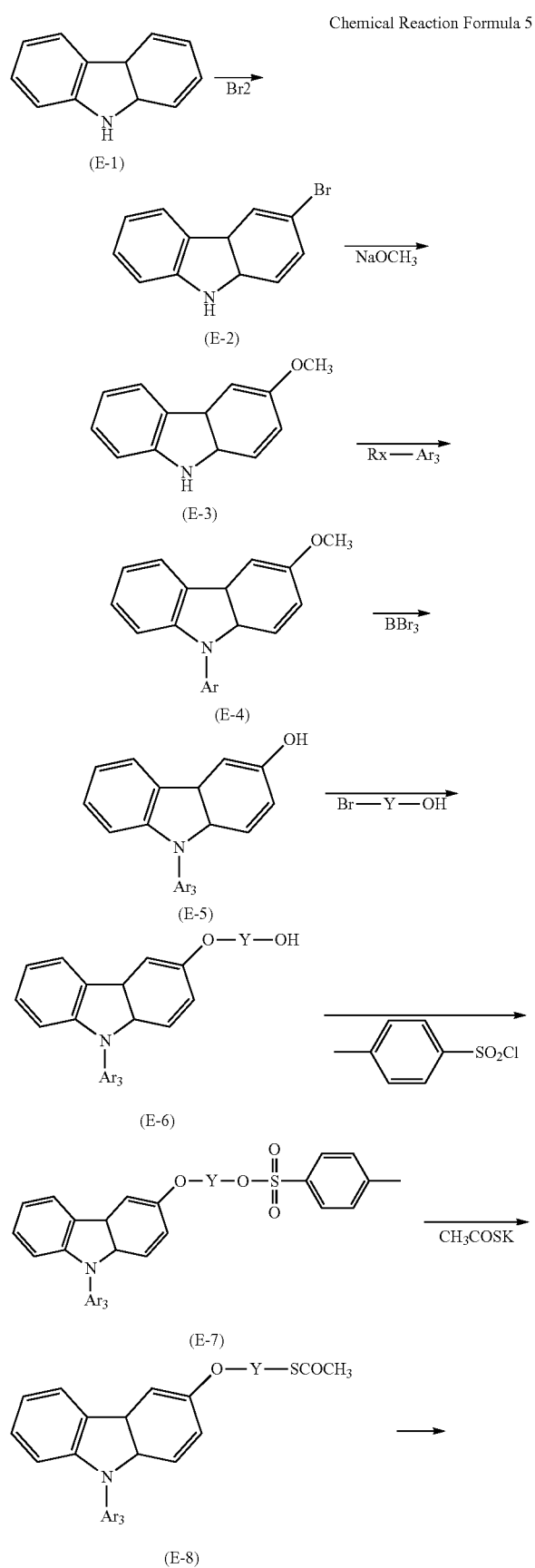
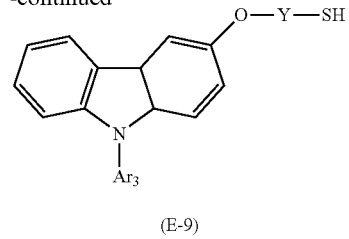

In the chemical reaction formula 5, Rx represents a halogen atom.

First, using bromine under the presence of a base such as pyridine, 3-bromocarbazole (E-2) is obtained by brominating the carbazole (E-1).

Next, using sodium methoxide under the presence of copper iodine, 3-methoxycarbazole (E-3) is obtained by etherifying 3-bromocarbazole (E-2).

Furthermore, a carbazole derivative (E-4) is obtained by conducting Ullmann reaction or Buchwald-Hartwig amination reaction of 3-methoxycarbazole (E-3) with halogenated aryl Rx—Ar$_3$.

Next, using boron tribromide, a carbazole derivative (E-5) is obtained by demethylating the carbazole derivative (E-4).

Furthermore, a carbazole derivative (E-6) is obtained by conducting ether reaction of the carbazole derivative (E-5) with bromo alcohol Br—Y—OH.

Next, using chlorinated p-toluene sulphonyl under the presence of a base such as pyridine, a carbazole derivative (E-7) is obtained by tosylating a carbazole derivative (E-6).

Furthermore, using potassium thioacetate, a carbazole derivative (E-8) is obtained by thioacetylating the carbazole derivative (E-7).

Next, using a base such as sodium hydroxide, a carbazole derivative (E-9) is obtained by hydrolyzing the carbazole derivative (E-8).

In the present disclosure, there is no specific limit to the selection of the semiconductor nanocrystal. Specific examples thereof include, but are not limited to, III-V compounds formed of a group 13 element and a group 15 element in the periodic table, IIA-VIB compound formed of a group 2 element and a group 16 element in the periodic table, IIB-VIB compounds formed of a group 12 element and a group 16 element in the periodic table, II-V compounds formed of a group 12 element and a group 15 element in the periodic table, III-V compounds formed of a group 13 element and a group 15 element in the periodic table, III-IV compounds formed of a group 13 element and a group 14 element in the periodic table, III-VI compounds formed of a group 13 element and a group 16 element in the periodic table, IV-VI compounds formed of a group 14 element and a group 16 element in the periodic table, I-III-V compounds formed of a group 11 element, a group 13 element, and a group 15 element in the periodic table, and II-IV-VI compounds formed of a group 12 element, a group 14 element, and a group 16 element in the periodic table. These can be used alone or in combination.

In addition, the semiconductor nanocrystal may contain a third element, a fourth element, and a doping agent. There is no specific limit to the form of the semiconductor nanocrystal. Specific examples of such forms include, but are not limited to, spherical, semi-spherical, a bar from, a disc form, a tetrapot form, and a star form.

In addition, when the semiconductor nanocrystal is spherical, the primary average particle diameter of the semiconductor nanocrystal is from 0.5 nm to 30 nm and preferably from 1 nm to 15 nm. The particle size distribution of the semiconductor nanocrystal has an impact on the chromaticity of luminescence and preferably is narrow to obtain a vivid luminescent color with a narrow half value width.

There is no specific limit to the method of manufacturing the semiconductor nanocrystal. Specific examples thereof are described in pages 27 and 28, and 48 to 180 of "Nano particle science—from basic principle to application—" (ISBN978-4-86043-175-4 C3040, published by N.T.S.), WO2005/106082, WO2007/020416, WO2007/049052, and WO2010/015824.

A semiconductor nanocrystal to which a carbazole derivative is coordination-bonded or attached can be obtained by substituting a capping agent (surface active agent) existing on the surface of a semiconductor nanocrystal with the carbazole derivative. For example, a semiconductor nanocrystal is added to a solution in which a carbazole derivative is dissolved in a polar solvent such as methylene chloride, chloroform, and dichloroethane in an inert gas followed by mixing and stirring at 0° C. to 30° C. for 12 hours or longer and preferably 24 hours or longer. Thereafter, the solution is cleaned with a solvent having a relatively low boiling point such as methanol, ethanol, isopropyl alcohol, methylene chloride, chloroform, acetone, tetrahydrofuran, and hexane with ultrasonic to obtain a semiconductor nanocrystal to which a carbazole derivative is coordination-bonded or attached.

The substitution of a capping agent (surface active agent) existing on the surface of a semiconductor nanocrystal with a carbazole derivative can be confirmed by FT-IR (Infra-red spectroscopy) or XPS (X-ray photoemission spectroscopy).

The semiconductor nanocrystal may have a component present on the surface in addition to the carbazole derivative. There is no specific limit to the selection of the component other than the carbazole derivative. A specific example thereof is the capping agent (surface active agent) for use in manufacturing the semiconductor nanocrystal.

In addition, the carbazole derivative may be coordination-bonded to the semiconductor nanocrystal or attached to the semiconductor nanocrystal by mutual action such as intermolecular force with the carbazole derivative coordination-bonded to the semiconductor nanocrystal.

In the present disclosure, while the semiconductor nanocrystal functions as the luminous source, the carbazole derivative has a function of transferring the excitation energy to the semiconductor nanocrystal by dipolar interaction, i.e., a function of Forster energy transfer and/or directly infusing charges (positive hole and electron) into the semiconductor nanocrystal. Therefore, since the luminous quantum yield of the semiconductor nanocrystal increases, the light emitting device of the present disclosure has an excellent luminance efficiency.

To efficiently conduct Forster energy transfer to the semiconductor nanocrystal, the carbazole derivative that is coordination-bonded or attached to the semiconductor nanocrystal is required to have a smaller ionization potential (Ip) and a larger electron affinity (Ea) than the semiconductor nanocrystal. Therefore, $Ar_1$, $Ar_2$, and $Ar_3$ in the chemical structure 1 and R in the chemical structures 4 and 5 are suitably selected based on the semiconductor nanocrystal.

In addition, to efficiently conduct Forster energy transfer to the semiconductor nanocrystal and/or infuse charges thereto, it is preferable that the carbazole remaining group which is the main skeletone of the carbazole derivative is present close to the semiconductor nanocrystal. Therefore, X and Y in the chemical structure 2 are suitably selected.

Furthermore, in the chemical structure 2, Z is a group coordination-bonded or attached to the semiconductor nanocrystal and suitably selected based on the semiconductor nanocrystal.

As described above, the semiconductor nanocrystal to which a carbazole derivative is coordination-bonded or attached functions as a luminous material of the light emitting device and a light emitting device having an excellent luminance efficiency can be obtained by suitably having a good combination of the size of the semiconductor nanocrystal, the size distribution, the form and the composition, and the structure of the carbazole derivative in terms of the objective of the light emitting device.

Any light emitting device that has a luminous layer containing a semiconductor nanocrystal to which a carbazole derivative is coordination-bonded or attached is suitably used in the present disclosure. Specific examples thereof include, but are not limited to, an electroluminescence (EL) device and a photoluminescence (PL) device.

The EL device as the light emitting device of the present disclosure is obtained by combining a luminous layer containing a semiconductor nanocrystal to which at least one carbazole derivative is coordination-bonded or attached and a carrier transport material for use in, for example, any known organic EL device. For example, an EL device can be obtained by suitably combining a luminous layer containing a semiconductor nanocrystal to which a carbazole derivative is coordination-bonded or attached with a hole infusion layer, a hole transport layer, a hole block layer, a charge transport layer, and an electron infusion layer. There is no specific limit to the structure of the electroluminescence device. Specific examples of laminate structures thereof include, but are not limited to, Positive electrode/hole transport layer/luminous layer/negative electrode Positive electrode/hole infusion layer/hole transport layer/luminous layer/negative electrode Positive electrode/hole transport layer/luminous layer/electron transport layer/negative electrode Positive electrode/hole infusion layer/hole transport layer/luminous layer/electron transport layer/negative electrode Positive electrode/hole transport layer/luminous layer/electron transport layer/electron infusion layer/negative electrode Positive electrode/hole infusion layer/hole transport layer/luminous layer/electron transport layer/electron infusion layer/negative electrode Positive electrode/hole transport layer/luminous layer/hole block layer/electron transport layer/negative electrode Positive electrode/hole infusion layer/hole transport layer/luminous layer/hole block layer/electron transport layer/negative electrode Positive electrode/hole transport layer/luminous layer/hole block layer/electron transport layer/electron infusion layer/negative electrode Positive electrode/hole infusion layer/hole transport layer/luminous layer/hole block layer/electron transport layer/electron infusion layer/negative electrode.

Optionally, a sealing layer can be formed on the negative electrode.

In the laminate structure described above, the luminous layer that contains semiconductor nanocrystal to which a carbazole derivative is coordination-bonded or attached may further contain a hole transport material, an electron transport material and/or a dipolar material.

In addition, two or more luminous layers containing a semiconductor nanocrystal to which different carbazole derivatives are coordination-bonded or attached can be laminated in the laminate structure described above.

Furthermore, a laminate structure is also suitable in which a luminous layer containing a semiconductor nanocrystal to which a carbazole derivative is coordination-bonded or attached further contains a hole transport material, an electron transport material, and/or a dipolar material to form a positive electrode/luminous layer/negative electrode.

The EL device preferably has a laminate structure in which respective layers described above are laminated on a substrate.

The work function of the positive electrode is greater than 4 eV and preferably 4.8 eV.

Specific examples of the materials that form the positive electrode include, but are not limited to, metals such as gold, platinum, palladium, silver, tungsten, nickel, and cobalt, alloyed metals thereof, metal oxides such as ITO, $SnO_2$, and ZnO, and CuI.

The positive electrode formed of ITO preferably has a smooth surface and the surface is washed and/or cleaned before use. There is no specific limit to the washing (cleaning) method. Specific examples thereof include, but are not limited to, a method of irradiation of ultraviolet in ozone atmosphere and a method of plasma treatment in oxygen atmosphere.

The work function of the negative electrode is smaller than 4 eV. Metals and alloyed metals are used.

There is no specific limit to the selection of the material that forms the negative electrode. Specific examples thereof include, but are not limited to, metals such as cesium, sodium, calcium, magnesium, lithium, aluminum, and samarium and alloys thereof.

When the EL device is used as a surface light emitting device, at least one of the positive electrode and the negative electrode is sufficiently transparent in the luminous wavelength range and the other side has a sufficient reflectivity in the luminous wavelength range.

There is no specific limit to the selection of the transparent electrode. A specific example thereof is ITO. There is no specific limit to the selection of the substrate that forms a transparent electrode. A specific example thereof is a transparent board such as a glass board and a plastic board.

When the electroluminescence device is used as an edge light emitting device, it is not necessary that at least one of the positive electrode and the negative electrode is sufficiently transparent in the luminous wavelength range.

There is no specific limit to the selection of the material that forms the hole transport layer. Specific examples thereof include, but are not limited to, a low molecular weight triaryl amine derivative, a triaryl amine polymer, a low molecular weight 3,6-diaryl carbazole derivative and a 3,6-diaryl carbazole polymer described in JP-2005-154412-A and JP-2005-158691-A, and a polythiophene derivative.

There is no specific limit to the selection of the material to form the hole infusion layer. Specific examples thereof include, but are not limited to, a phthalocyanine derivative, a porphyrin derivative, an oxaziazole derivative, a triazole derivative, a triaryl amine derivative, a polyphenylene diamine derivative, a polythiophene derivative, and a water-soluble PEDOT-PSS (polyethylene dioxathiophene-polystyrene sulphonic acid).

There is no specific limit to the selection of the electron transport material to form the electron transport layer and the hole block layer. Specific examples thereof include, but are not limited to, a fluorenone derivative, an anthraquinone dimethane derivative, a diphenoquinone derivative, a thiopyranediooxide derivative, a perylenetetracarboxylic acid derivative, a fluorenylidene methane derivative, an anthraquinone dimethane derivative, an anthrone derivative, a phenanthroline derivative, an oxadiazole derivative, and a triazole derivative.

There is no specific limit to the selection of the material to form the electron infusion layer. Specific examples thereof include, but are not limited to, lithium fluoride, 8-hydroxyquinolinola tolithium complex, a lithium complex of phenanthroline derivative, and a lithium complex of phenoxypyridine.

There is no specific limit to the selection of the method of forming each layer of the luminous layer, the hole infusion layer, the hole transport layer, the hole block layer, the electron transport layer, and the electron infusion layer. Specific examples thereof include, but are not limited to, a vacuum deposition method, an ion deposition method, a spin-coating method, a cast method, an inkjet method, and a micro-contact method. There is no specific limit to the selection of the solvent for use in forming each layer by the spin-coating method, the cast method, the inkjet method, and the micro-contact method. Specific examples thereof include, but are not limited to, a hydrocarbon-based solvent, a halogen-based solvent, a ketone-based solvent, an ether-based solvent, an ester-based solvent, a non-protone solvent, and water.

The thickness of each layer of the luminous layer, the hole infusion layer, the hole transport layer, the hole block layer, the electron transport layer, and the electron infusion layer is from 1 nm to 5 µm.

The PL device as the light emitting device of the present disclosure can be obtained by combining a luminous layer that contains a semiconductor nanocrystal to which at least one carbazole derivative is coordination-bonded or attached as a color filter or a color change film with a liquid crystal layer, a liquid crystal molecular orientation layer, a transparent electrode, a transparent counter electrode, a light polarizer, and a backlight, which are used in a typical liquid crystal display device.

The light emitting device of the present disclosure can be applied to a display unit such as a liquid crystal display. Such a display unit may have a device to make the light emitting device luminous. Specific examples there of include, but are not limited to, a light source or a circuit that generates exciting light.

Having generally described preferred embodiments of this invention, further understanding can be obtained by reference to certain specific examples which are provided herein for the purpose of illustration only and are not intended to be limiting. In the descriptions in the following examples, the numbers represent weight ratios in parts, unless otherwise specified.

EXAMPLES

The present disclosure is described with reference to Examples but not limited thereto.

Synthesis of Carbazole Derivative 1

Add 14.31 g (44.0 mmol) of 3.6-dibromo carbazole (A-1), 25.01 g (176.1 mmol) of 5-methyl-2-thiophen boronic acid, and 1.30 g of tetrakis(triphenylphosphine) palladium to a solvent mixture of 180 ml of toluene and 60 ml of ethanol; add an aqueous solution in which 37.3 g of sodium carbonate is dissolved in 90 ml of distilled water to the liquid mixture; reflux the mixture for 15 hours while heating in nitrogen atmosphere; next, filter the resultant with celite with heat to remove insoluble matters; separate the organic layer; distill away the solvent under a reduced pressure; subsequent to water-washing of the residual matter, dry the resultant to obtain a yellow brown solid; refine the resultant with silica gel column chromatography using a solvent mixture of methylene chloride and hexane as an eluting solution to obtain 12.25 g of 3,6-bis(5-methylthiophene-2-yl)carbazole (A-2); mix 8.07 g (22.4 mmol) of the thus obtained 3,6-bis(5-methylthiophene-2-yl)carbazole, 21.00 g (89.7 mmol) of 4-iodine anisole, 0.71 g of copper powder, and 12.40 g of potassium carbonate; reflux the mixture for six hours while heating in nitrogen atmosphere followed by cooling-down to 100° C.; next, add 80 ml of toluene to the resultant; filter the resultant with celite with heat to remove insoluble matters; distill away the solvent under a reduced pressure; dissolve the residual in methylene chloride followed by water-washing; dry the resultant to obtain brown liquid; next, refine the resultant with silica gel column chromatography using a solvent mixture of methylene chloride and hexane as an eluting solution to obtain 4.39 g of 3,6-bis(5-methylthiophene-2-yl)-9-(4-methoxyphenyl)carbazole (B-2); dissolve 3.73 g (8.0 mmol) of the thus obtained 3,6-bis(5-methylthiophene-2-yl)-9-(4-methoxyphenyl)carbazole in 30 ml of methylene chloride; drip 8 ml of a methylene chloride solution of 1M boron tribromide to the resultant solution at −10° C. followed by stirring at room temperature; subsequent to water-washing, dry the resultant and thereafter remove the solvent to obtain a gray solid; furthermore, refine the resultant with silica gel column chromatography using a solvent mixture of methylene chloride and hexane as an eluting solution to obtain 3.47 g of 3,6-bis(5-methylthiophene-2-yl)-9-(4-hydroxyphenyl)carbazole (B-3); dissolve 1.81 g (4.0 mmol) of the thus obtained 3,6-bis(5-methylthiophene-2-yl)-9-(4-hydroxyphenyl)carbazole and 4.35 g (16.0 mmol) of 1,8-dibromooctane in 20 ml of methylethyl ketone; add 0.83 g of potassium carbonate to the solution; reflux the solution for seven hours while heating; next, filter the resultant to remove insoluble matters; distill away the solvent under a reduced pressure; dissolve the residual in methylene chloride followed by water-washing; dry the resultant and thereafter remove the solvent to obtain pale yellow liquid; next, refine the resultant with silica gel column chromatography using a solvent mixture of methylene chloride and hexane as an eluting solution to obtain 1.83 g of 3,6-bis(5-methylthiophene-2-yl)-9-[4-(8-bromooctyloxy)phenyl]carbazole; dissolve 1.50 g (2.3 mmol) of the thus obtained 3,6-bis(5-methylthiophene-2-yl)-9-[4-(8-bromooctyloxy)phenyl]carbazole in a solvent mixture of 20 ml of tetrahydrofuran (THF) and 20 ml of ethanol; add 0.40 g (3.5 mmol) of potassium thioacetate to the solution in nitrogen atmosphere; reflux the solution for five hours while heating followed by cooling down to room temperature; pour water to the solution followed by extraction with methylene chloride; subsequent to water-washing, dry the resultant and thereafter remove the solvent to obtain a pale yellow white solid; furthermore, refine the resultant with silica gel column chromatography using a solvent mixture of methylene chloride and hexane as an eluting solution to obtain 1.22 g of 8-{4-[3,6-bis(5-methylthiophene-2-yl)-9-yl]phenoxy}octylester (C-3); dissolve 1.02 g (1.6 mmol) of the thus obtained 8-{4-[3,6-bis(5-methylthiophene-2-yl)-9-yl]phenoxy}octylester in a solvent mixture of 30 ml of tetrahydrofuran (THF) and 10 ml of ethanol in nitrogen atmosphere; add 0.5 ml of NaOH aqueous solution having 50% by weight to the solution followed by stirring at room temperature for one hour; pour water to the solution followed by extraction with chloroform; subsequent to water-washing, dry the resultant and thereafter distill away the solvent to obtain a coarse product; next, refine the resultant with silica gel column chromatography using a solvent mixture of chloroform and hexane as an eluting solution to obtain 0.86 g of 8-{4-[3,6-bis(5-methylthiophene-2-yl)carbazole-9-yl]phenoxy}octane-1-thiol (C-4) (hereinafter referred to as carbazole derivative 1) represented by the following chemical structure 7.

Chemical Structure 7

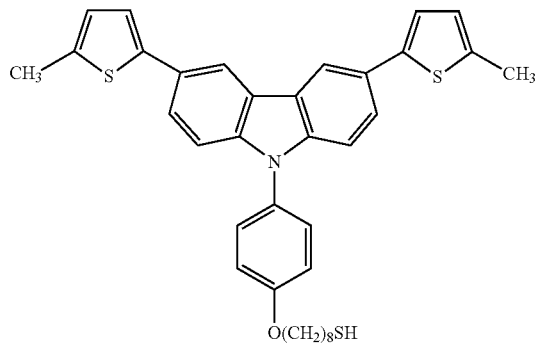

FIG. 1 is a graph illustrating the infra red spectrum of carbazole derivative 1. The infra red spectrum is measured by KBr tablet method.

Synthesis of Carbazole Derivative 2 dissolve 4.20 g (9.9 mmol) of 3,6-diphenyl-9-(4-methoxyphenyl)carbazole (B-2) in 30 ml of methylene chloride; drip 10 ml of a methylene chloride solution of 1M boron tribromide to the resultant solution at −10° C. followed by stirring at room temperature; next, subsequent to water-washing, dry the resultant and thereafter distill away the solvent to obtain 3.98 g of 3,6-dipihenyl-9(4-hydroxyphenyl)carbazole (B-3); dissolve 1.54 g (3.7 mmol) of the thus obtained 3,6-dipihenyl-9(4-hydroxyphenyl)carbazole in 20 ml of N,N-dimethylformamide; add 0.25 g (5.7 mmol) of hydrogenated sodium having 55% by weight while cooling with iced water followed by stirring for one hour; next, add 1.16 g (5.5 mmol) of 8-bromo-1-octanol to the resultant followed by stirring at room temperature for three hours; pour water to the solution followed by extraction with ethylacetate; dry the resultant and thereafter distill away the solvent to obtain 1.90 g of 8-[4-(3,6-dipihenylcarbazole-9-yl)phenoxy]octane-1-ol (B-4); dissolve 2.80 g (5.2 mmol) of the thus obtained 8-[4-(3,6-dipihenylcarbazole-9-yl)phenoxy]octane-1-ol in a solvent mixture of 10 ml of methylene chloride and 5 ml of pyridine; add 1.20 g (6.3 mmol) of chlorinated p-toluene sulphonyl at −2° C. to the solution followed by stirring at room temperature; pour water to the solution followed by extraction with ethylacetate; subsequent to washing with water and diluted hydrochloric acid, dry the resultant and thereafter distill away the solvent to obtain a coarse product; furthermore, refine the resultant with silica gel column chromatography using a solvent mixture of ethylacetate and toluene as an eluting solution to obtain 1.95 g of toluene-4-sulphonic acid 8-[4-(3,6-diphenylcarbazole-9-yl)phenoxy]octyl ester (C-2) having a colorless platelet; dissolve 1.90 g (2.7 mmol) of the thus obtained toluene-4-sulphonic acid 8-[4-(3,6-diphenylcarbazole-9-yl)phenoxy]octyl ester in a solvent mixture of 40 ml of tetrahydrofuran (THF) and 20 ml of ethanol; add 0.55 g (4.8 mmol) of potassium thioacetate to the solution in nitrogen atmosphere; reflux the solution for seven hours while heating followed by cooling down to room temperature; pour water to the solution followed by extraction with ethylacetate; furthermore, subsequent to washing with water, dry the resultant, and distill away the solvent to obtain a coarse product; next, refine the resultant with silica gel column chromatography using toluene as an eluting solution to obtain 1.32 g of pale orange oily matter of thioacetate 8-[4-(3,6-diphenylcarbazole-9-yl)phenoxy]octyl ester (C-3); dissolve 1.32 g (2.2 mmol) of the thus obtained thioacetate 8-[4-(3,6-diphenylcarbazole-9-yl)phenoxy]octyl ester in a solvent mixture of 25 ml of tetrahydrofuran (THF) and 10 ml of ethanol in nitrogen atmosphere; add 0.5 ml of NaOH aqueous solution having 50% by weight to the solution followed by stirring at room temperature for 30 minutes; pour water to the solution followed by extraction with chloroform; furthermore, subsequent to washing with water, dry the resultant and thereafter distill away the solvent to obtain a coarse product; furthermore, subsequent to washing with water, dry the resultant and thereafter distill away the solvent to obtain a coarse product; and refine the resultant with silica gel column chromatography using a solvent mixture of chloroform and hexane as an eluting solution to obtain 0.82 g of 8-[4-(3,6-diphenylcarbazole-9-yl)phenoxy]octane-1-thiol (C-4) (hereinafter referred to as carbazole derivative 2) having a colorless needle-like crystal represented by the following chemical structure 8.

Chemical Structure 8

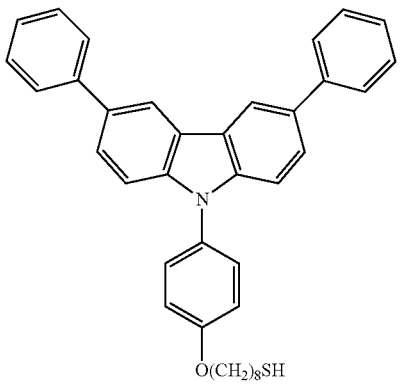

Figure 2:
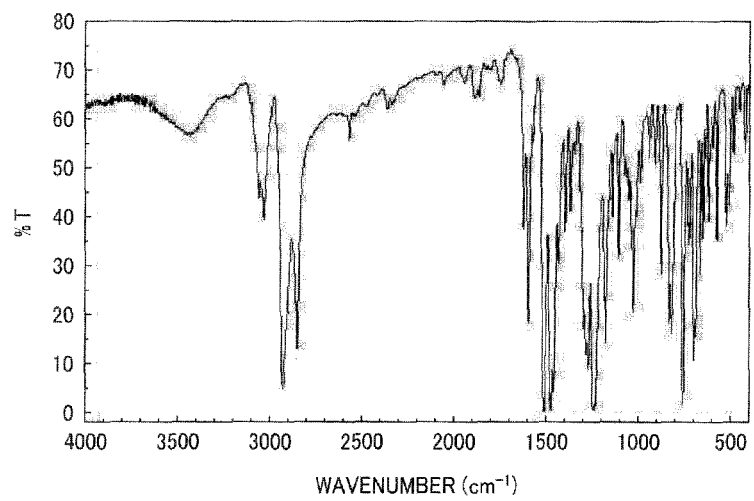
FIG. 2 is a graph illustrating the infra red spectrum of carbazole derivative 2 described later.

FIG. 2 is a graph illustrating the infra red spectrum of carbazole derivative 2. The infra red spectrum is measured by KBr tablet method.

The analysis results of carbazole derivative 2 are shown below:

Melting point: 131.0° C. to 131.5° C.

Element analysis value [measured value (calculated value)]: C, 81.70 (82.12); H, 6.57 (6.71); N, 2.45 (2.52); S, 5.68 (5.77).

Synthesis of Carbazole Derivative 3

Demethylate 3-methoxy-9-phenylcarbazole (E-4) in the same manner as in Synthesis of Carbazole Derivative 1 to obtain 3-hydroxy-9-phenylcarbazole (E-5) having a colorless needle-like form with a yield of 91.8%; etherify the thus obtained 3-hydroxy-9-phenylcarbazole having a colorless needle-like form with 8-bromooctanol in the same manner as in Synthesis of Carbazole Derivative 2 to obtain 3-(8-hydroxyoctyloxy)-9-phenyl carbazole (E-6) having a colorless needle-like form with a yield of 84.3%; tosylate, thioacetylate, and hydlolyze the thus obtained 3-(8-hydroxyoctyloxy)-9-phenyl carbazole in the same manner as in Synthesis of Carbazole Derivative 2 to obtain 3-(8-meracaptooctyloxy)-9-phenyl carbazole (E-9) (hereinafter referred to as carbazole derivative 3) having a colorless needle-like form represented by the chemical structure 9.

Chemical Structure 9

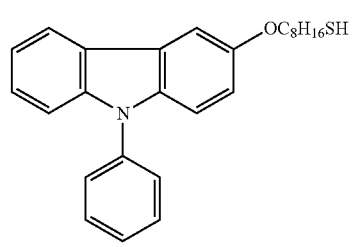

Figure 3:
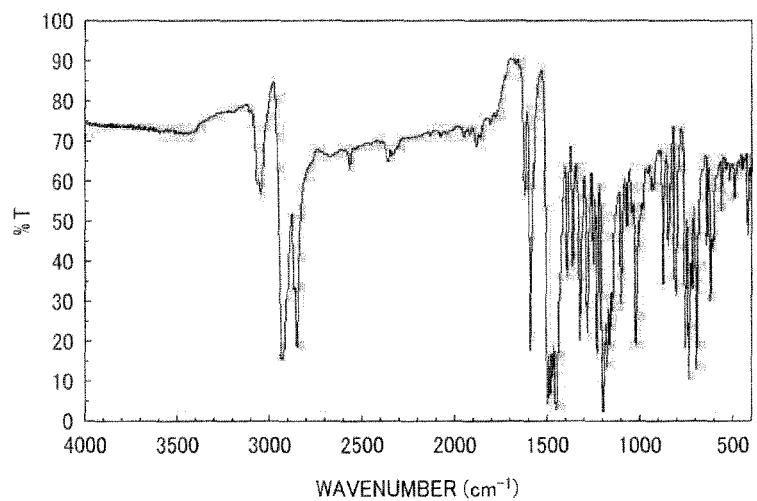
FIG. 3 is a graph illustrating the infra red spectrum of carbazole derivative 3 described later.

FIG. 3 is a graph illustrating the infra red spectrum of carbazole derivative 3. The infra red spectrum is measured by KBr tablet method.

The analysis results of carbazole derivative 3 are shown below:

Melting point: 52.5° C. to 55.5° C.

Element analysis value (%) [measured value (calculated value)]: C, 77.32 (77.38); H, 7.15 (7.24); N, 3.40 (3.47); S, 7.74 (7.95).

Synthesis of Carbazole Derivative 4

Stir a mixture of 2.17 g of benzo[a]carbazole (D-5), 3.50 g of 4-(8-hydroxyoctyloxy)iodine benzene, 2.80 g of potassium carbonate, 0.50 g of copper powder, and 15 ml of nitrobenzene for six hours at 190° C. to 200° C. in nitrogen atmosphere and then cool down the mixture to room temperature; next, remove insoluble matters by celite filtration and then distill away the solvent by heat under a reduced pressure; next, refine the resultant with silica gel column chromatography using a liquid mixture of toluene and ethyl acetate as an eluting solution to obtain 3.3 g of a pale bark oily matter of N-[4-(8-hydroxyoctyloxyphenyl)]-11H-benzo[a]carbazole (D-6)); and then, tosylate, thioacetylate, and hydrolyze the thus obtained N-[4-(8-hydroxyoctyloxyphenyl)]-11H-benzo [a]carbazole in the same manner as in Synthesis of Carbazole Derivative 2 to obtain N-4[(8-mercaptooctyloxyphenyl)]-11H-benzo[a]carbazole (D-9) (hereinafter referred to as carbazole derivative 4) having a colorless prism crystal represented by the chemical structure 10;

Chemical Structure 10

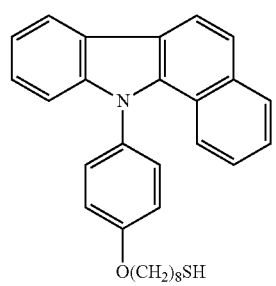

Figure 4:
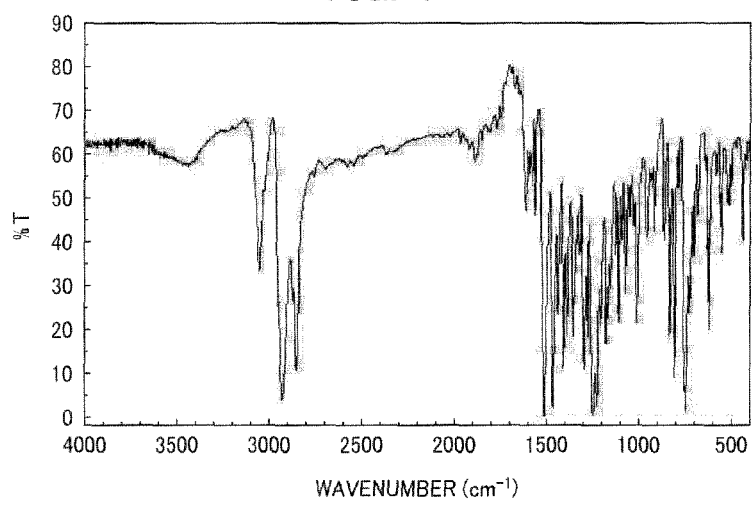
FIG. 4 is a graph illustrating the infra red spectrum of carbazole derivative 4 described later.

FIG. 4 is a graph illustrating the infra red spectrum of carbazole derivative 4. The infra red spectrum is measured by KBr tablet method.

The analysis results of carbazole derivative 4 are shown below:

Melting point: 75.0° C. to 76.0° C.

Element analysis value (%) [measured value (calculated value)]: C, 79.48 (79.43); H, 6.76 (6.89); N, 2.78 (3.09); S, 6.99 (7.07).

Synthesis of Carbazole Derivative 5

Add 80 ml of toluene, 20 ml of ethanol, and 40 g of 2M sodium carbonate aqueous solution to 6.50 g of 2,7-dibromocarbazole, 7.32 g of phenyl boronic acid, 0.734 g of tetrakis triphenyl phosphine palladium; reflux the mixture for three hours while heating in nitrogen atmosphere followed by cooling down to room temperature; filter the mixture to remove insoluble matters; distill away the solvent to obtain 4.15 g of pale bark powder of 2,7-diphenyl carbazole; mix 4.01 g of the thus obtained 2,7-diphenyl carbazole, 4.37 g of 4-(8-hydroxyoctyloxy)iodine benzene, 3.45 g of potassium carbonate, 0.5 g of copper powder, and 20 ml of nitrobenzene; reflux the mixture for seven hours while heating in nitrogen atmosphere followed by cooling down to room temperature; filter the mixture to remove insoluble matters; distill away the solvent; next, refine the resultant with silica gel column chromatography using a liquid mixture of ethyl acetate and hexane as an eluting solution to obtain 2.0 g of a pale bark oily matter of 2.7-diphenyl-N-[4-(8-hydroxyoctyloxyphenyl)]carbazole; and then, tosylate, thioacetylate, and hydrolyze the thus obtained 2.7-diphenyl-N-[4-(8-hydroxyoctyloxyphenyl)]carbazole in the same manner as in Synthesis of Carbazole Derivative 2 to obtain 2,7-diphenyl-N-[4-(8-mercaptooctyloxyphenyl)]carbazole (hereinafter referred to as carbazole derivative 5) having a colorless needle-like crystal represented by the chemical structure 11.

Chemical Structure 11

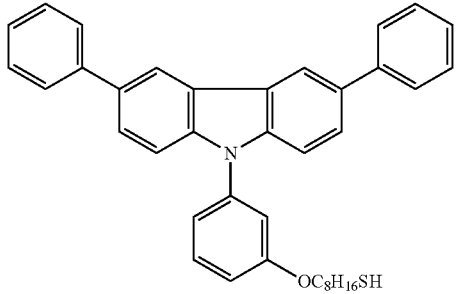

Figure 5:
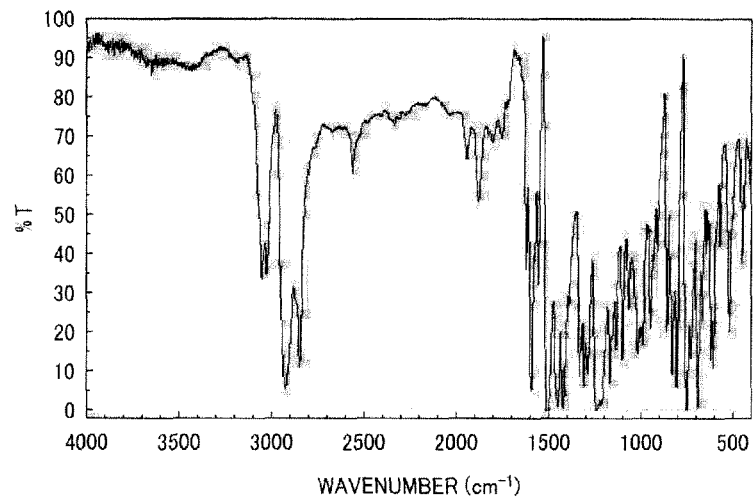
FIG. 5 is a graph illustrating the infra red spectrum of carbazole derivative 5 described later.

FIG. 5 is a graph illustrating the infra red spectrum of carbazole derivative 5. The infra red spectrum is measured by KBr tablet method.

The analysis results of carbazole derivative 5 are shown below:

Melting point: 132.5° C. to 133.5° C.

Element analysis value (%) [measured value (calculated value)]: C, 82.37 (82.12); H, 6.66 (6.71); N, 2.43 (2.52); S, 5.70 (5.77).

Synthesis of Carbazole Derivative 6

A colorless viscous matter of 8-[3-(3,6-diphenylcarbazole-9-yl)phenoxy]octane-1-thiol (C-4) (hereinafter referred to as carbazole derivative 6) represented by the chemical structure 12 is obtained in the same manner as in preparation of Carbazole Derivative 1 except that 3,6-diphenyl-9-(3-methoxyphenyl)carbazole is used instead of 3,6-bis(5-methylthiophene-2-yl)-9-(4-methoxyphenyl)carbazole (B-2).

Chemical Structure 12

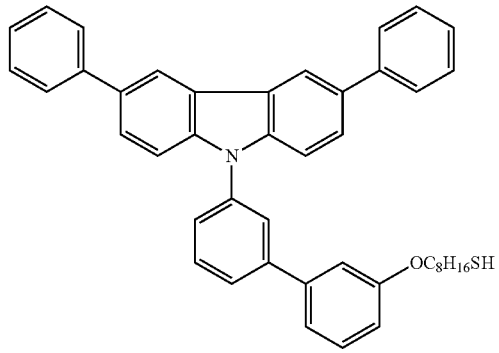

Figure 6:
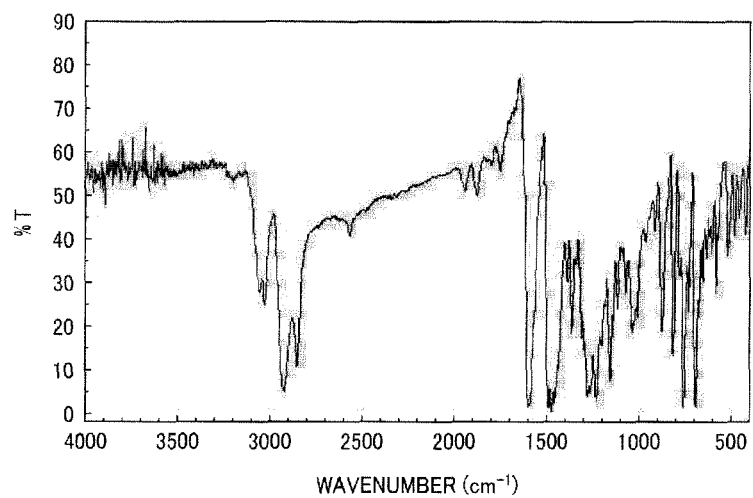
FIG. 6 is a graph illustrating the infra red spectrum of carbazole derivative 6 described later.

FIG. 6 is a graph illustrating the infra red spectrum of carbazole derivative 6. The infra red spectrum is measured by liquid membrane technique.

Synthesis of Carbazole Derivative 7

Mix 2.80 g (8.77 mmol) of 3,6-diphenylcarbazole, 22.18 g (87.7 mmol) of 1-bromo-3-iodine benzene, 0.279 g of copper powder, and 4.85 g of potassium carbonate; heat the mixture at 190° C. for nine hours in nitrogen atmosphere followed by cooling down to room temperature; next, dilute the mixture with methylene chloride followed by water-washing and drying to obtain pale brown liquid; furthermore, refine the resultant with silica gel column chromatography using a liquid mixture of methylene chloride and hexane as an eluting solution to obtain 3.59 g of 9-(3-bromophenyl)-3,6-diphenyl carbazole; add 3.20 g (6.75 mmol) of the thus obtained 9-(3-bromophenyl)-3,6-diphenyl carbazole, 1.54 g (10.1 mmol) of 3-methoxyphenyl boronic acid, and 0.124 g of tetrakis(triphenyl phosphine)palladium to a liquid mixture of 30 ml of toluene and 10 ml of ethanol; add an aqueous solution in which 37.3 g of sodium carbonate is dissolved in 90 ml of distilled water to the mixture; reflux the mixture for nine hours while heating in nitrogen atmosphere followed by cooling down to room temperature; next, dilute the mixture with methylene chloride; remove insoluble matters by filtration; wash the organic layer with water for separation; distill away the solvent under a reduced pressure; and furthermore, refine the resultant with silica gel column chromatography using a liquid mixture of methylene chloride and hexane as an eluting solution to obtain 2.89 g of [3'-(3,6-diphenylcarbazole-9-yl)biphenyl-3-yloxy]methane; and prepare 8-[3'-(3,6-diphenylcarbazole-9-yl)biphenyl-3-yloxy]octane-1-thiol (C-4) (hereinafter referred to as carbazole derivative 7) represented by the chemical structure 13 in the same manner as in preparation of Carbazole Derivative 1 except that the thus obtained [3'-(3,6-diphenylcarbazole-9-yl)biphenyl-3-yloxy]methane is used instead of 3,6-bis(5-methylthiophene-2-yl)-9-(4-methoxyphenyl)carbazole (B-2).

Chemical Structure 13

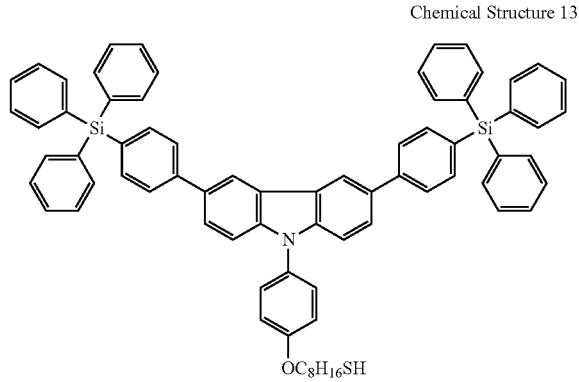

Figure 7:
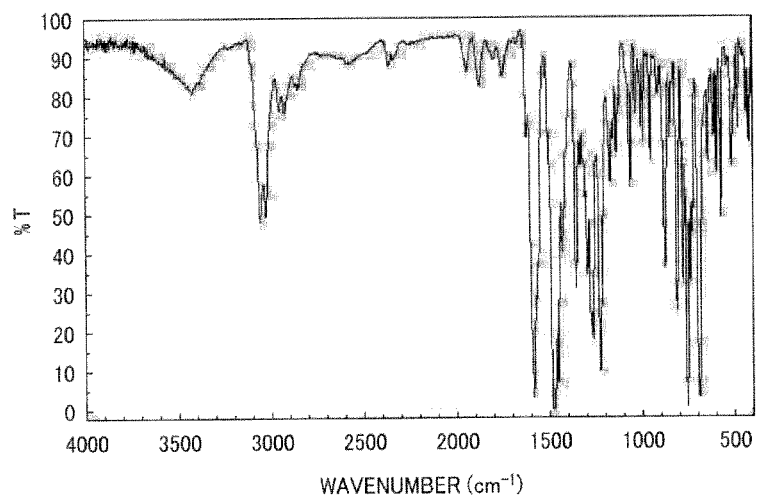
FIG. 7 is a graph illustrating the infra red spectrum of carbazole derivative 7 described later.

FIG. 7 is a graph illustrating the infra red spectrum of carbazole derivative 7. The infra red spectrum is measured by KBr tablet method.

Synthesis of Carbazole Derivative 8

8-{4-[3,6-bis(4-triphenyl silyl)phenyl]carbazole-9-yl]phenoxy}octane-1-thiol (C-4) (hereinafter referred to as carbazole derivative 8) represented by the chemical structure 14 is obtained in the same manner as in preparation of Carbazole Derivative 1 except that the 4-triphenylsilylbenzene boronic acid neopentyl glycol ester is used instead of 5-methyl-2-thiphene boronic acid.

Chemical Structure 14

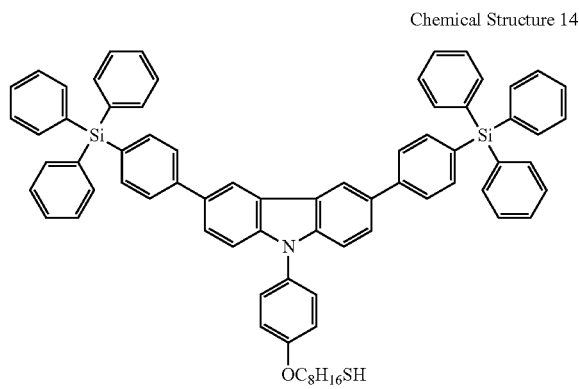

Figure 8:
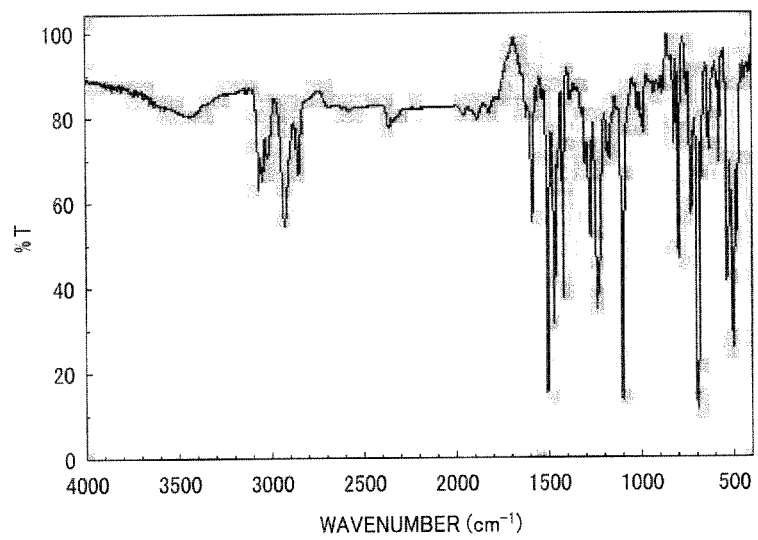
FIG. 8 is a graph illustrating the infra red spectrum of carbazole derivative 8 described later.

FIG. 8 is a graph illustrating the infra red spectrum of carbazole derivative 8. The infra red spectrum is measured by KBr tablet method.

Manufacturing of Semiconductor NanoCrystal InP/ZnS/ZnO

As in the method described in Examples 4 and 5 of WO2010/015824, a semiconductor nanocrystal InP/ZnS/ZnO is obtained using 10-undecylenic acid as a capping agent (surface active agent).

Manufacturing of Semiconductor Nano Crystal to which Carbazole Derivative is Coordination-Bonded or Attached Dissolve 0.01 g of the carbazole derivative in 2 ml of methylene chloride at room temperature in argon atmosphere; next, add 0.5 ml of a liquid dispersion in which semiconductor nanocrystal InP/ZnS/ZnO is dispersed in toluene with a ratio of 10 mg/ml to the solution in argon atmosphere followed by stirring at room temperature for 24 hours; Furthermore, add 20 ml of dried tetrahydrofuran to the resultant; subsequent to ultrasonic cleaning for five minutes, centrifugal the resultant; next, isolate the precipitate; repeat this process twice; furthermore, isolate the precipitate; and air-dry the precipitate in argon atmosphere to obtain a semiconductor nanocrystal to which a carbazole derivative is coordination-bonded or attached.

Example 1

Ultrasonic-clean an IOT substrate having a thickness of 110 nm with a neutral detergent, acetone, and isopropanol in that sequence followed by boil-washing with isopropanol and treatment in a UV-ozone chamber for 12 minutes; spin-coat Baytron® (P AI 4083, manufactured by H.C. Starck) of PEDOT-PSS solution on the ITO substrate; dry the substrate at 150° C. for 30 minutes to form a hole infusion layer having a thickness of 40 nm; spin-coat a chloroform solution of a polycarbonate on the hole infusion layer in nitrogen atmosphere followed by drying at 100° C. for 30 minutes to form a hole transport layer having a thickness of 40 nm; the used polycarbonate has the structure unit deriving from 3,6-bis(4-hydroxyphenyl)-N-phenylcarbazole described in Example 1 of JP-2005-54165-A and the structure unit deriving from 4,4'-isopropylidene diphenol with a molar ratio of 1 to 1; spin-coat a liquid dispersion in nitrogen atmosphere on the hole transport layer in which the semiconductor nanocrystal to which the carbazole derivative 1 is coordination-bonded or attached is dispersed in toluene followed by drying at 100° C. for 30 minutes to form a luminous layer having a thickness of 15 nm; using a vacuum deposition device, deposit 3,5,3',5'-tetrakis(m-pyrido-3-yl)phenyl-[1,1']biphenyl on the luminous layer under a pressure of $1\times10^{-4}$ Pa to form an electron transport layer having a thickness of 50 nm; and next, deposit MgAg and Ag with a thickness of 100 nm and 10 nm, respectively via a shadow mask to form a negative electrode to obtain an EL device.

Figure 9:
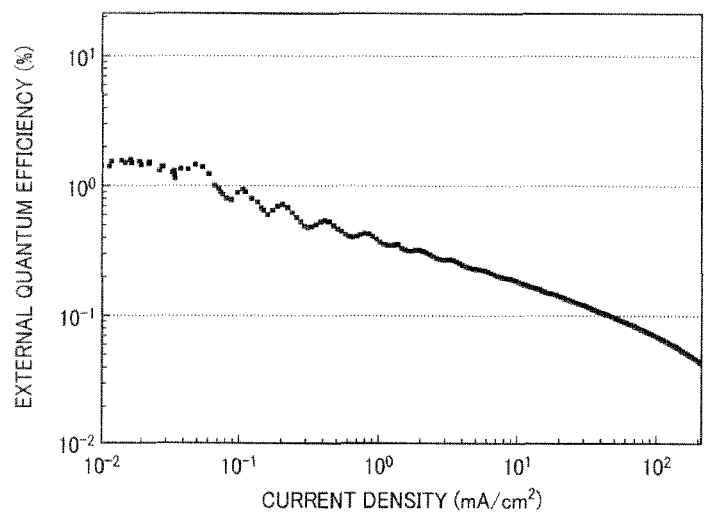
FIG. 9 is a graph illustrating the relationship between the current density and the external quantum efficiency of the EL (electroluminescence) device of Example 1 described later.

FIG. 9 is a graph illustrating the relationship between the current density and the external quantum efficiency of the EL device of Example 1. As seen in FIG. 9, the external quantum efficiency of the EL device of Example 1 has a maximum value of 1.4%.

Figure 10:
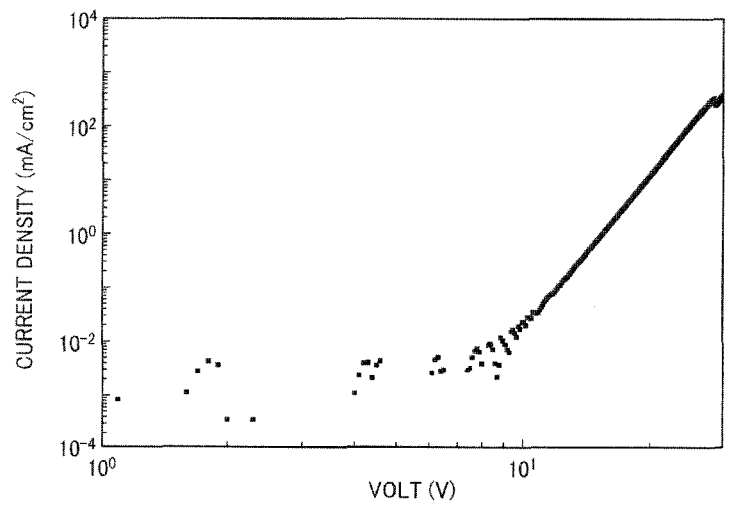
FIG. 10 is a graph illustrating the relationship between the voltage and the current density of the EL device of Example 1 described later.
Figure 11:
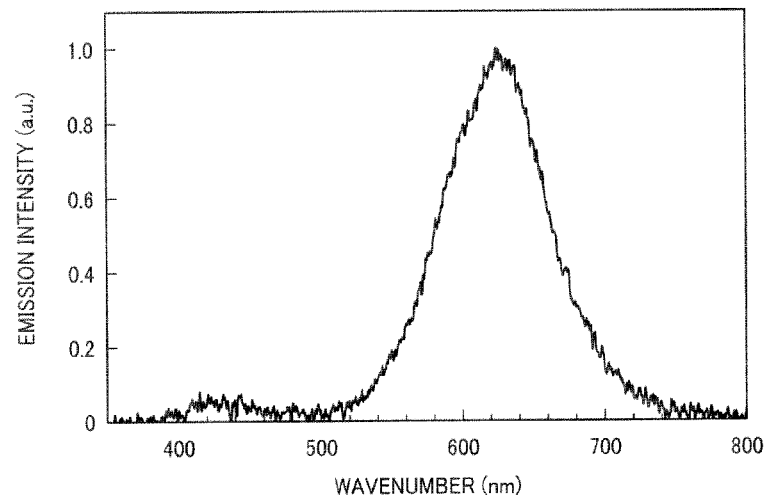
FIG. 11 is a graph illustrating the luminescence spectrum of the EL device of Example 1 described later.

FIG. 10 is a graph illustrating the relationship between the voltage and the current density of the EL device of Example 1;

FIG. 11 is a graph illustrating the luminescence spectrum when the current density of the EL device of Example 1 is 1 mA/cm². As seen in FIG. 11, the center wavelength of the luminescence of the EL device of Example 1 is found to be 624 nm.

Example 2

The EL device of Example 2 is obtained in the same manner as in Example 1 except that the semiconductor nanocrystal to which carbazole derivative 2 is coordination-bonded or attached is used instead of the semiconductor nanocrystal to which carbazole derivative 1 is coordination-bonded or attached.

Figure 12:
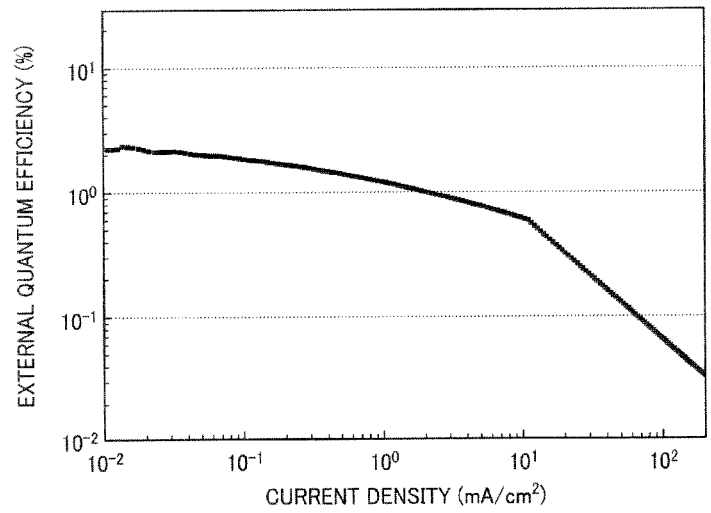
FIG. 12 is a graph illustrating the relationship between the current density and the external quantum efficiency of the EL device of Example 2 described later.

FIG. 12 is a graph illustrating the relationship between the current density and the external quantum efficiency of the EL device of Example 2. As seen in FIG. 12, the external quantum efficiency of the EL device of Example 2 has a maximum value of 2.3%.

Figure 13:
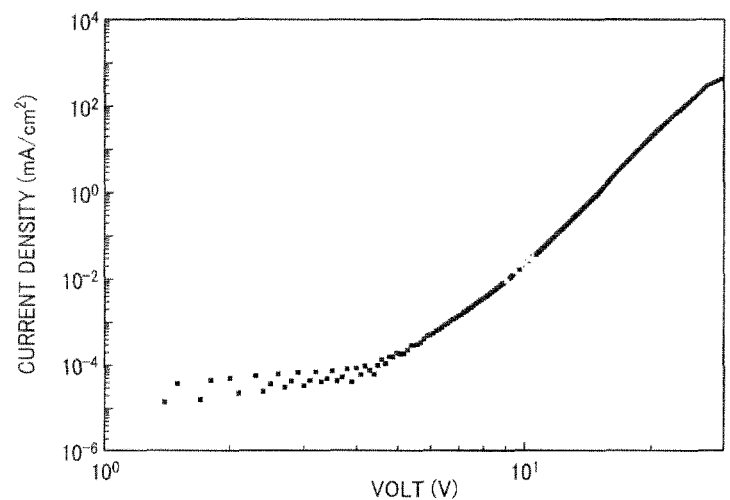
FIG. 13 is a graph illustrating the relationship between the voltage and the current density of the EL device of Example 2 described later.

FIG. 13 is a graph illustrating the relationship between the voltage and the current density of the EL device of Example 2.

Figure 14:
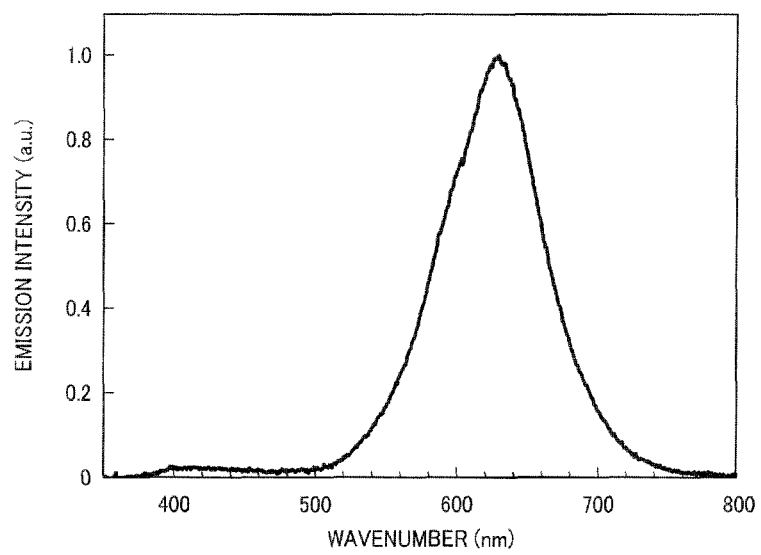
FIG. 14 is a graph illustrating the luminescence spectrum of the EL device of Example 2 described later.

FIG. 14 is a graph illustrating the luminescence spectrum when the current density of the EL device of Example 2 is 1 mA/cm$^2$. As seen in FIG. 14, the center wavelength of the luminescence of the EL device of Example 2 is found to be 630 nm.

Comparative Example 1

The electroluminescence device of Comparative Example 1 is obtained in the same manner as in Example 1 except that the semiconductor nanocrystal InP/ZnS/ZnO is used instead of the semiconductor nanocrystal to which carbazole derivative 1 is coordination-bonded or attached.

Figure 15:
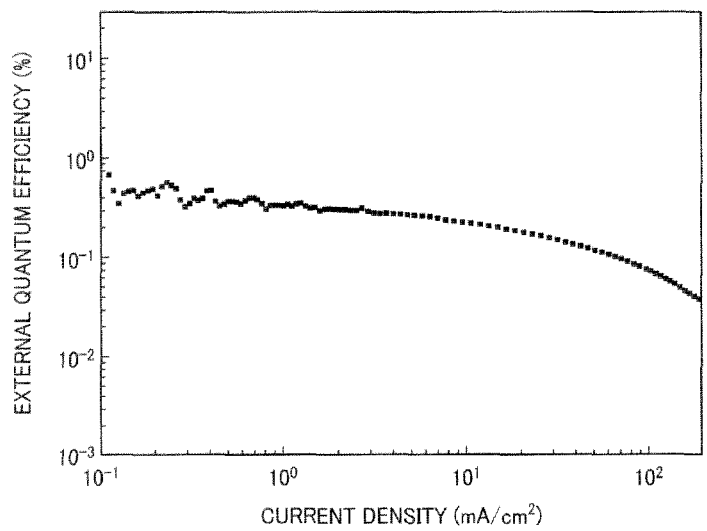
FIG. 15 is a graph illustrating the relationship between the current density and the external quantum efficiency of the EL device of Comparative Example 1 described later.

FIG. 15 is a graph illustrating the relationship between the current density and the external quantum efficiency of the EL device of Comparative Example 1. As seen in FIG. 15, the external quantum efficiency of the EL device of Comparative Example 1 has a maximum value of 0.3%.

Figure 16:
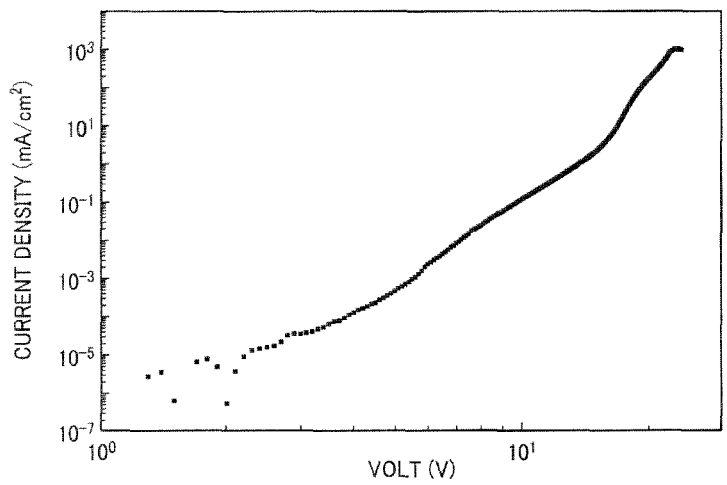
FIG. 16 is a graph illustrating the relationship between the voltage and the current density of the EL device of Comparative Example 1 described later.

FIG. 16 is a graph illustrating the relationship between the voltage and the current density of the EL device of Comparative Example 1.

Figure 17:
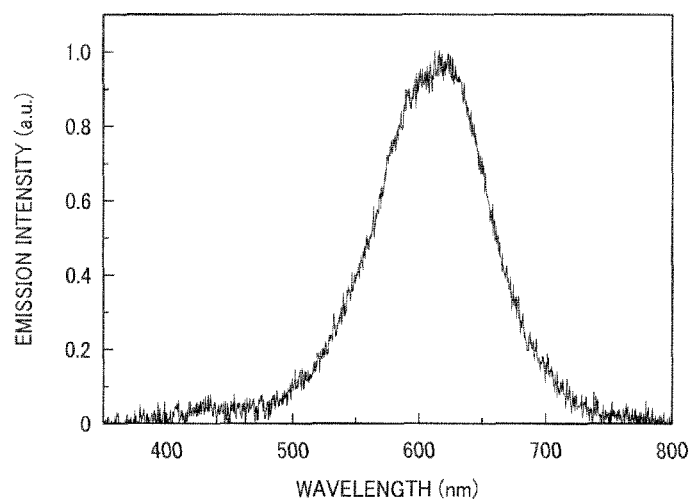
FIG. 17 is a graph illustrating the luminescence spectrum of the EL device of Comparative Example 1 described later.

FIG. 17 is a graph illustrating the luminescence spectrum when the current density of the EL device of Comparative Example 1 is 1 mA/cm$^2$. As seen in FIG. 17, the center wavelength of the luminescence of the EL device of Comparative Example 1 is found to be 625 nm.

Example 3

Ultrasonic-clean an IOT substrate having a thickness of 110 nm with a neutral detergent, acetone, and isopropanol in that sequence followed by boil-washing with isopropanol and treatment in a UV-ozone chamber for 12 minutes; spin-coat PEDOT-PSS solution (conductive grade, manufactured by Sigma-Aldrich Corporation) on the ITO substrate; dry the substrate at 150° C. for 30 minutes; form a hole infusion layer having a thickness of 40 nm; spin-coat a chloroform solution of a polycarbonate on the hole infusion layer in nitrogen atmosphere followed by drying at 100° C. for 30 minutes to form a hole transport layer having a thickness of 40 nm; the used polycarbonate has the structure unit deriving from 3,6-bis(4-hydroxyphenyl)-N-phenylcarbazole described in Example 1 of JP-2005-54165-A and the structure unit deriving from 4,4'-isopropylidene diphenol with a molar ratio of 1 to 1; spin-coat a liquid dispersion in nitrogen atmosphere on the hole transport layer in which the semiconductor nanocrystal to which the carbazole derivative 3 is coordination-bonded or attached is dispersed in toluene followed by drying at 100° C. for 30 minutes to form a luminous layer having a thickness of 12 nm; using a vacuum deposition device, deposit 3,5,3',5'-tetrakis(m-pyrido-3-yl)phenyl-[1,1']biphenyl on the luminous layer under a pressure of $1 \times 10^{-4}$ Pa to form an electron transport layer having a thickness of 50 nm; and next, deposit LiF and Al with a thickness of 0.5 nm and 80 nm, respectively via a shadow mask to form a negative electrode to obtain an EL device.

Figure 18:
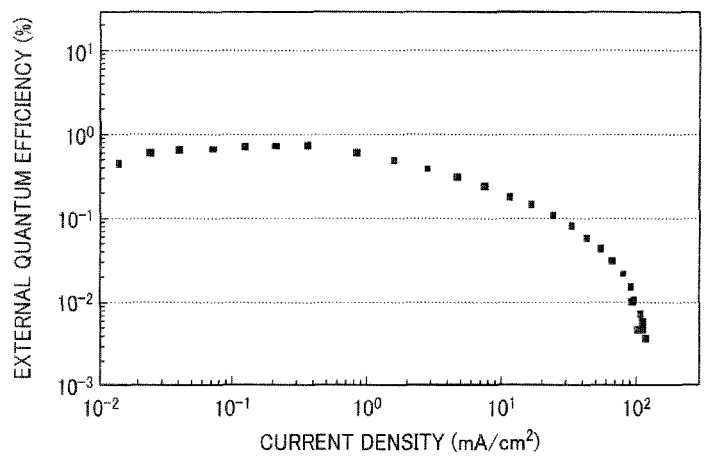
FIG. 18 is a graph illustrating the relationship between the current density and the external quantum efficiency of the EL device of Example 3 described later.

FIG. 18 is a graph illustrating the relationship between the current density and the external quantum efficiency of the EL device of Example 3. As seen in FIG. 18, the external quantum efficiency of the EL device of Example 3 has a maximum value of 0.74%.

Figure 19:
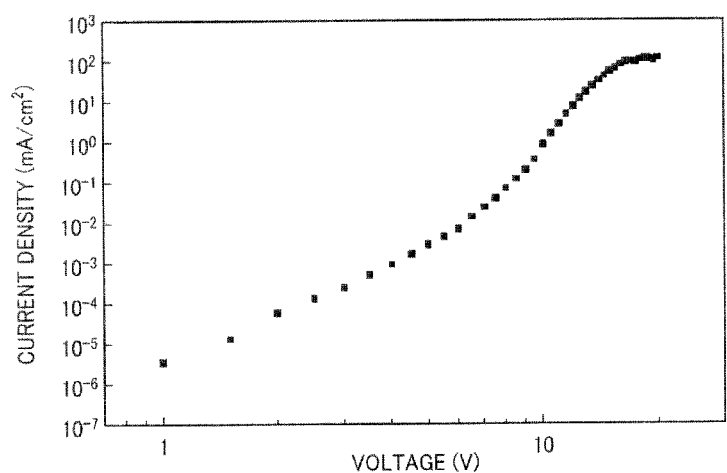
FIG. 19 is a graph illustrating the relationship between the voltage and the current density of the EL device of Example 3 described later.

FIG. 19 is a graph illustrating the relationship between the voltage and the current density of the EL device of Example 3.

Figure 20:
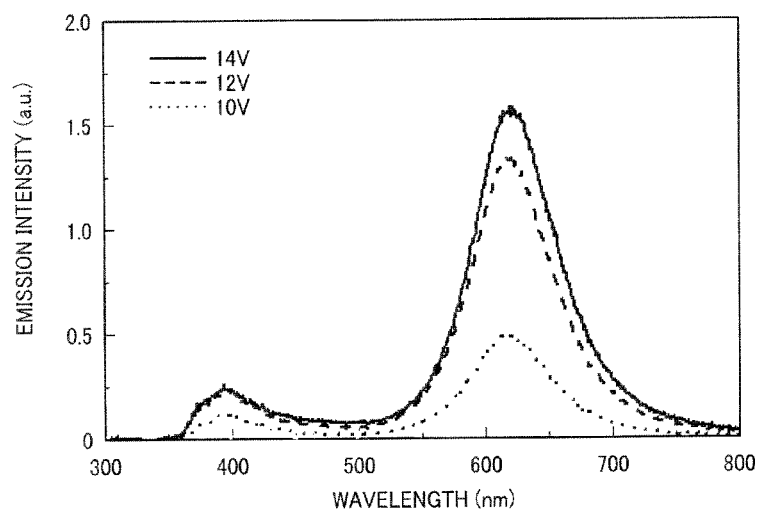
FIG. 20 is a graph illustrating the luminescence spectrum of the EL device of Example 3 described later.

FIG. 20 is a graph illustrating the luminescence spectrum when the voltage of the EL device of Example 3 is 10 V, 12 V, and 14 V. As seen in FIG. 20, the center wavelength of the luminescence of the EL device of Example 3 is found to be 621 nm.

Example 4

The EL device of Example 4 is obtained in the same manner as in Example 3 except that the semiconductor nanocrystal to which carbazole derivative 4 is coordination-bonded or attached is used instead of the semiconductor nanocrystal to which carbazole derivative 3 is coordination-bonded or attached.

Figure 21:
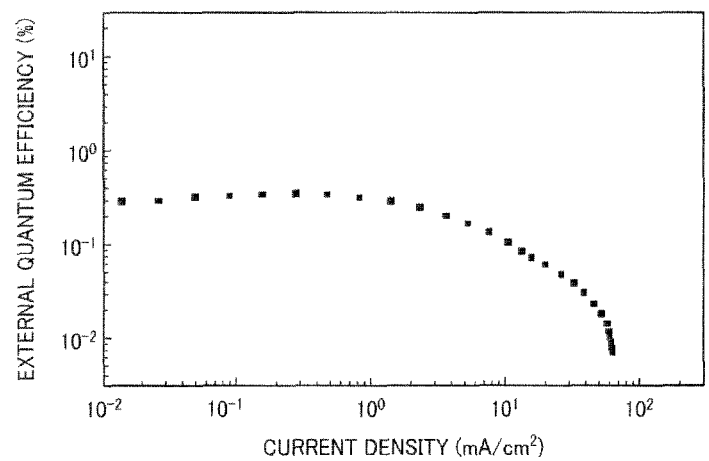
FIG. 21 is a graph illustrating the relationship between the current density and the external quantum efficiency of the EL device of Example 4 described later.

FIG. 21 is a graph illustrating the relationship between the current density and the external quantum efficiency of the EL device of Example 4. As seen in FIG. 21, the external quantum efficiency of the EL device of Example 4 has a maximum value of 0.34%.

Figure 22:
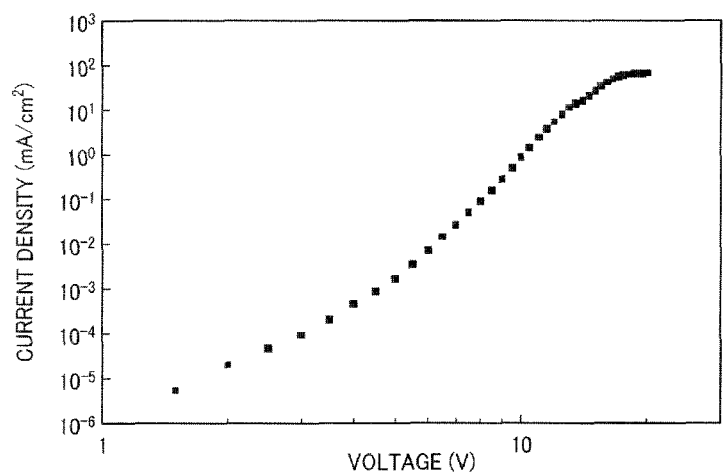
FIG. 22 is a graph illustrating the relationship between the voltage and the current density of the EL device of Example 4 described later.

FIG. 22 is a graph illustrating the relationship between the voltage and the current density of the EL device of Example 4.

Figure 23:
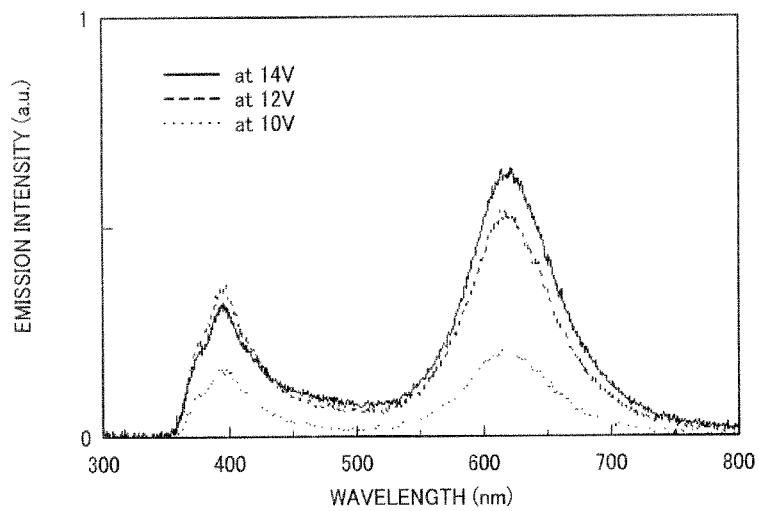
FIG. 23 is a graph illustrating the luminescence spectrum of the EL device of Example 4 described later.

FIG. 23 is a graph illustrating the luminescence spectrum when the voltage of the EL device of Example 4 is 10 V, 12 V, and 14V. As seen in FIG. 23, the center wavelength of the luminescence of the EL device of Example 4 is found to be 622 nm.

Example 5

The EL device of Example 5 is obtained in the same manner as in Example 3 except that the semiconductor nanocrystal to which carbazole derivative 5 is coordination-bonded or attached is used instead of the semiconductor nanocrystal to which carbazole derivative 3 is coordination-bonded or attached.

Figure 24:
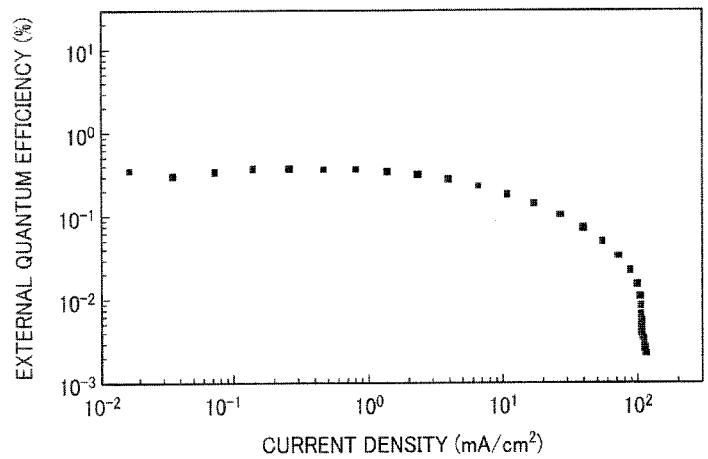
FIG. 24 is a graph illustrating the relationship between the current density and the external quantum efficiency of the EL device of Example 5 described later.

FIG. 24 is a graph illustrating the relationship between the current density and the external quantum efficiency of the EL device of Example 5. As seen in FIG. 24, the external quantum efficiency of the EL device of Example 5 has a maximum value of 0.37%.

Figure 25:
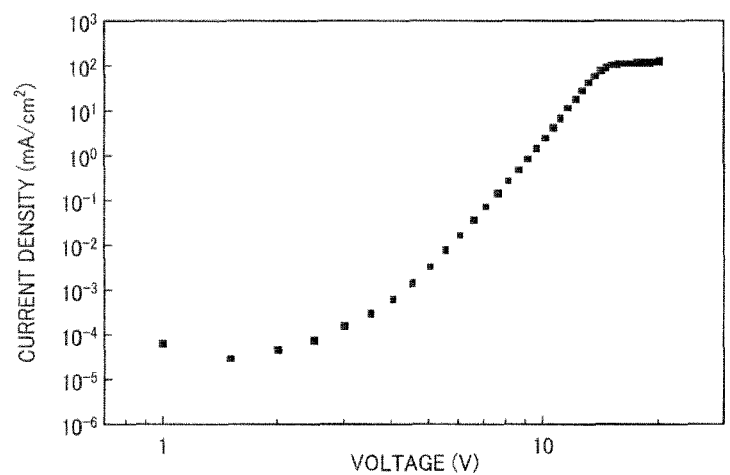
FIG. 25 is a graph illustrating the relationship between the voltage and the current density of the EL device of Example 5 described later.

FIG. 25 is a graph illustrating the relationship between the voltage and the current density of the EL device of Example 5.

Figure 26:
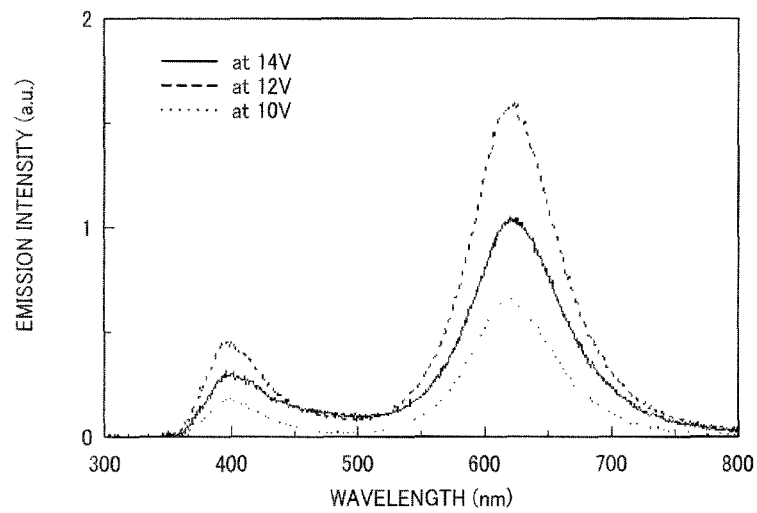
FIG. 26 is a graph illustrating the luminescence spectrum of the EL device of Example 5 described later.

FIG. 26 is a graph illustrating the luminescence spectrum when the voltage of the EL device of Example 5 is 10 V, 12 V, and 14 V. As seen in FIG. 26, the center wavelength of the luminescence of the EL device of Example 5 is found to be 621 nm.

Example 6

The EL device of Example 6 is obtained in the same manner as in Example 3 except that the semiconductor nanocrystal to which carbazole derivative 6 is coordination-bonded or attached is used instead of the semiconductor nanocrystal to which carbazole derivative 3 is coordination-bonded or attached.

Figure 27:
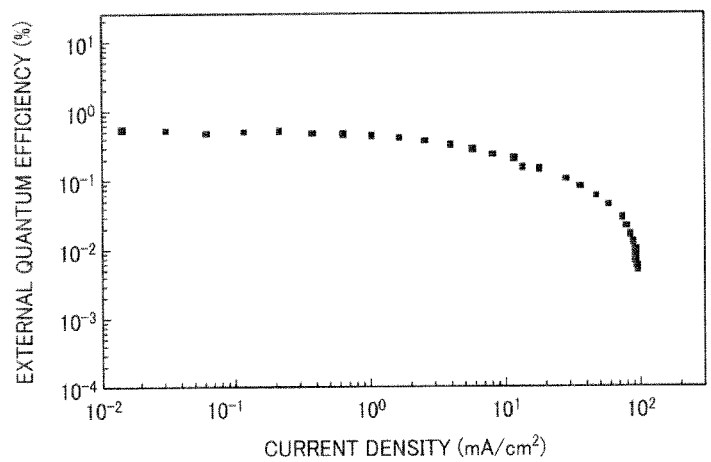
FIG. 27 is a graph illustrating the relationship between the current density and the external quantum efficiency of the EL device of Example 6 described later.

FIG. 27 is a graph illustrating the relationship between the current density and the external quantum efficiency of the EL device of Example 6. As seen in FIG. 27, the external quantum efficiency of the EL device of Example 6 has a maximum value of 0.52%.

Figure 28:
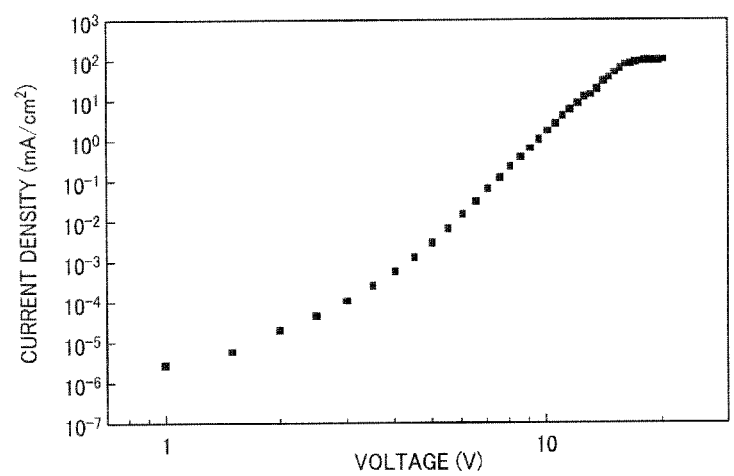
FIG. 28 is a graph illustrating the relationship between the voltage and the current density of the EL device of Example 6 described later.

FIG. 28 is a graph illustrating the relationship between the voltage and the current density of the EL device of Example 6.

Figure 29:
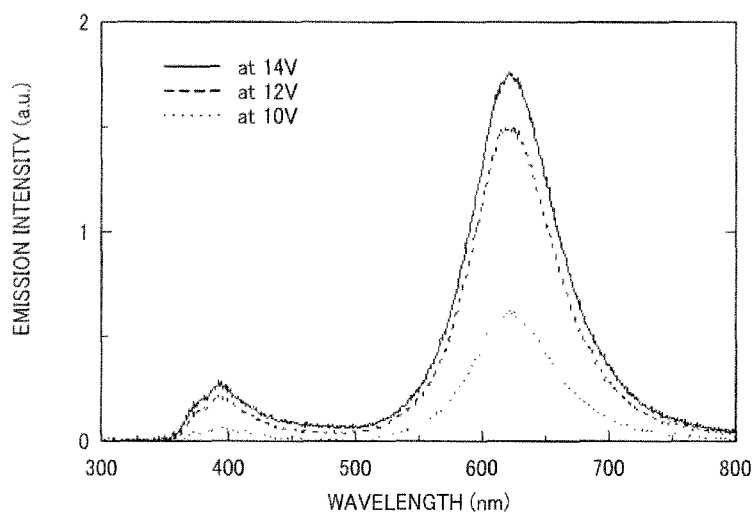
FIG. 29 is a graph illustrating the luminescence spectrum of the EL device of Example 6 described later.

FIG. 29 is a graph illustrating the luminescence spectrum when the voltage of the EL device of Example 6 is 10 V, 12 V, and 14 V. As seen in FIG. 29, the center wavelength of the luminescence of the EL device of Example 6 is found to be 622 nm.

Example 7

The EL device of Example 7 is obtained in the same manner as in Example 3 except that the semiconductor nanocrystal to which carbazole derivative 7 is coordination-bonded or attached is used instead of the semiconductor nanocrystal to which carbazole derivative 3 is coordination-bonded or attached.

Figure 30:
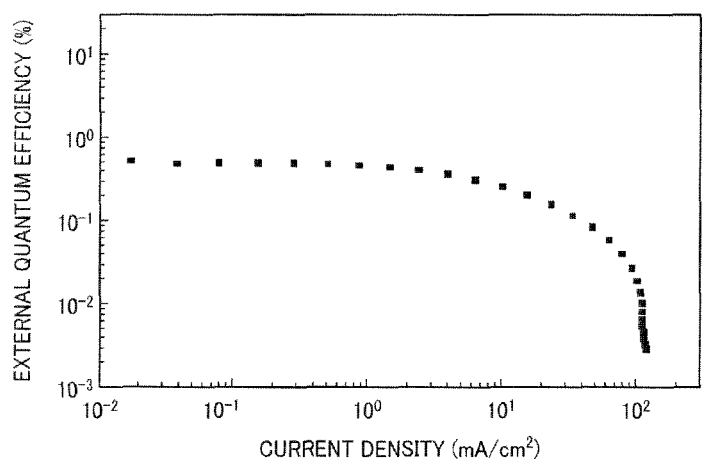
FIG. 30 is a graph illustrating the relationship between the current density and the external quantum efficiency of the EL device of Example 7 described later.

FIG. 30 is a graph illustrating the relationship between the current density and the external quantum efficiency of the EL device of Example 7. As seen in FIG. 30, the external quantum efficiency of the EL device of Example 7 has a maximum value of 0.60%.

Figure 31:
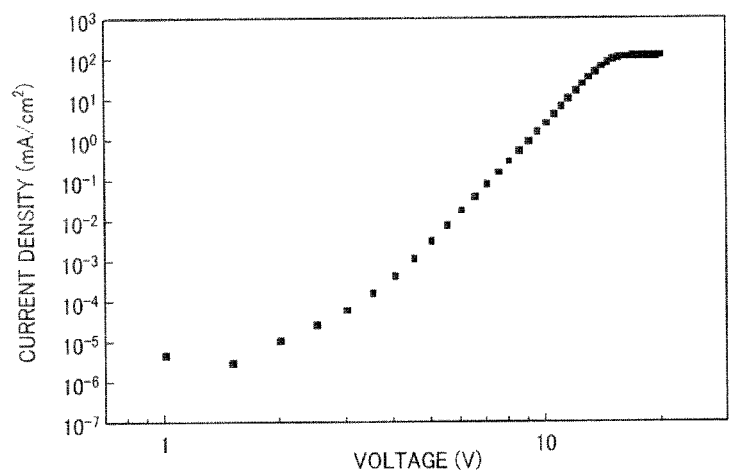
FIG. 31 is a graph illustrating the relationship between the voltage and the current density of the EL device of Example 7 described later.

FIG. 31 is a graph illustrating the relationship between the voltage and the current density of the EL device of Example 7.

Figure 32:
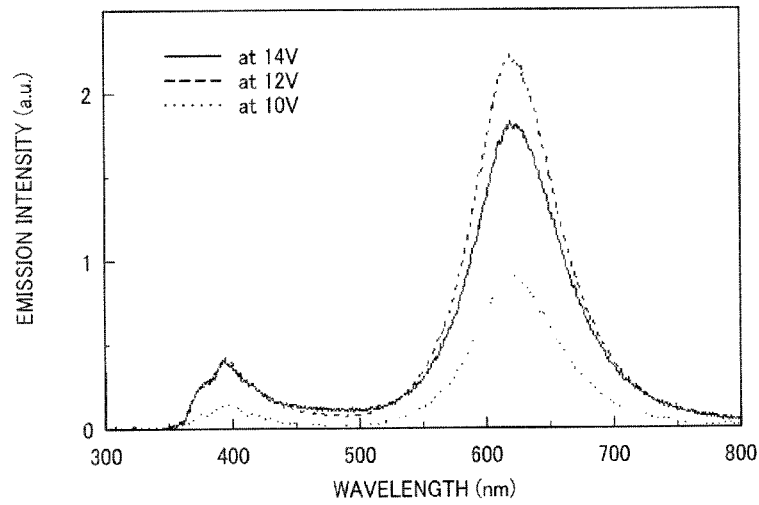
FIG. 32 is a graph illustrating the luminescence spectrum of the EL device of Example 7 described later.

FIG. 32 is a graph illustrating the luminescence spectrum when the voltage of the EL device of Example 7 is 10 V, 12 V, and 14 V. As seen in FIG. 32, the center wavelength of the luminescence of the EL device of Example 7 is found to be 620 nm.

Example 8

The EL device of Example 8 is obtained in the same manner as in Example 3 except that the semiconductor nanocrystal to which carbazole derivative 8 is coordination-bonded or attached is used instead of the semiconductor nanocrystal to which carbazole derivative 3 is coordination-bonded or attached.

Figure 33:
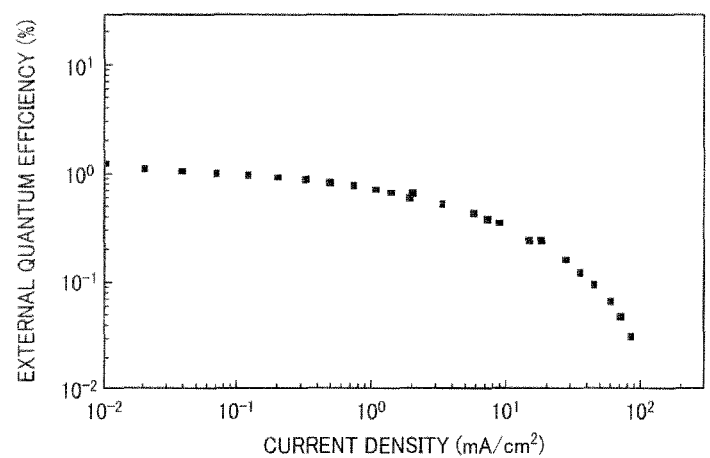
FIG. 33 is a graph illustrating the relationship between the current density and the external quantum efficiency of the EL device of Example 8 described later.

FIG. 33 is a graph illustrating the relationship between the current density and the external quantum efficiency of the EL device of Example 8. As seen in FIG. 33, the external quantum efficiency of the EL device of Example 8 has a maximum value of 1.2%.

Figure 34:
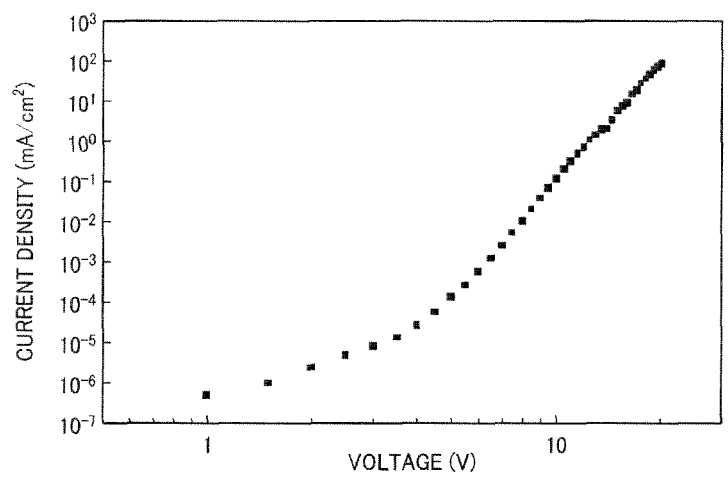
FIG. 34 is a graph illustrating the relationship between the voltage and the current density of the EL device of Example 8 described later.

FIG. 34 is a graph illustrating the relationship between the voltage and the current density of the EL device of Example 8.

Figure 35:
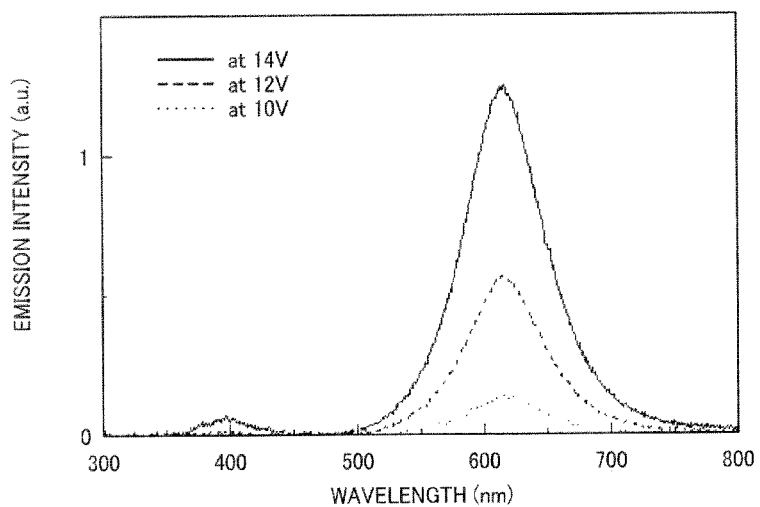
FIG. 35 is a graph illustrating the luminescence spectrum of the EL device of Example 8 described later.

FIG. 35 is a graph illustrating the luminescence spectrum when the voltage of the EL device of Example 8 is 10 V, 12 V, and 14 V. As seen in FIG. 35, the center wavelength of the luminescence of the EL device of Example 8 is found to be 620 nm.

Example 9

The EL device of Example 9 is obtained in the same manner as in Example 3 except that the semiconductor nanocrystal to which carbazole derivative 2 is coordination-bonded or attached is used instead of the semiconductor nanocrystal to which carbazole derivative 3 is coordination-bonded or attached.

Figure 36:
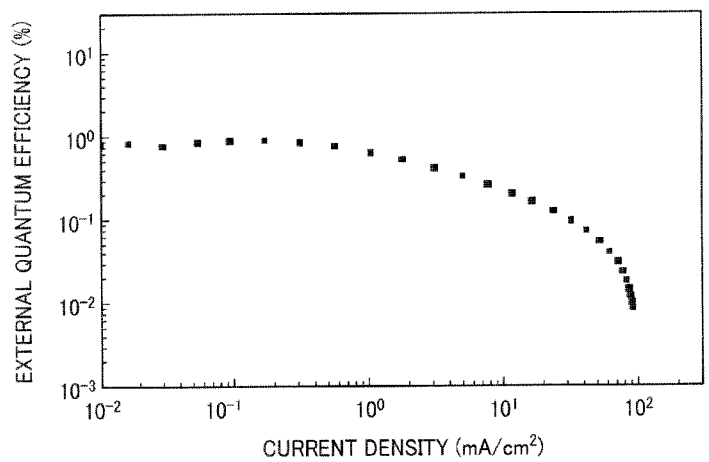
FIG. 36 is a graph illustrating the relationship between the current density and the external quantum efficiency of the EL device of Example 9 described later.

FIG. 36 is a graph illustrating the relationship between the current density and the external quantum efficiency of the EL device of Example 9. As seen in FIG. 36, the external quantum efficiency of the EL device of Example 9 has a maximum value of 1.0%.

Figure 37:
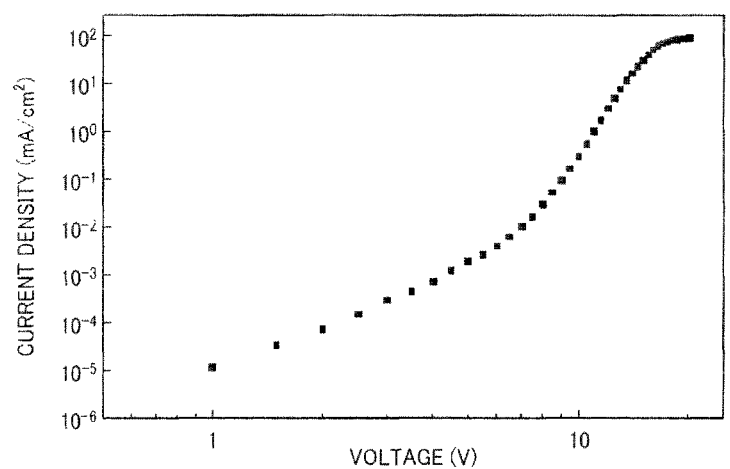
FIG. 37 is a graph illustrating the relationship between the voltage and the current density of the EL device of Example 9 described later.

FIG. 37 is a graph illustrating the relationship between the voltage and the current density of the EL device of Example 9.

Figure 38:
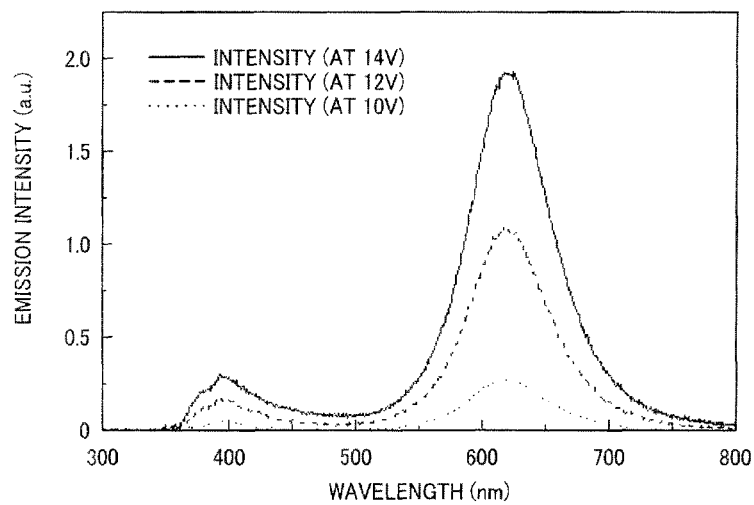
FIG. 38 is a graph illustrating the luminescence spectrum of the EL device of Example 9 described later.

FIG. 38 is a graph illustrating the luminescence spectrum when the voltage of the EL device of Example 8 is 10 V, 12 V, and 14 V. As seen in FIG. 38, the center wavelength of the luminescence of the EL device of Example 9 is found to be 619 nm.

Comparative Example 2

The electroluminescence device of Comparative Example 2 is obtained in the same manner as in Example 3 except that the semiconductor nanocrystal InP/ZnS/ZnO is used instead of the semiconductor nanocrystal to which carbazole derivative 3 is coordination-bonded or attached.

Figure 39:
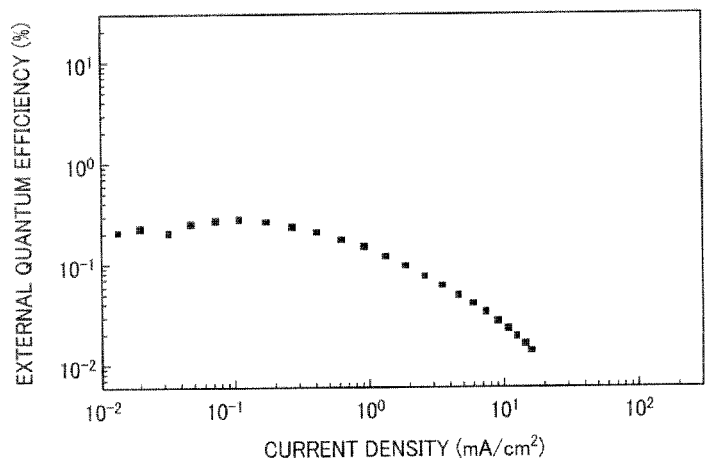
FIG. 39 is a graph illustrating the relationship between the current density and the external quantum efficiency of the EL device of Comparative Example 2 described later.

FIG. 39 is a graph illustrating the relationship between the current density and the external quantum efficiency of the EL device of Comparative Example 2. As seen in FIG. 39, the external quantum efficiency of the EL device of Comparative Example 2 has a maximum value of 0.28%.

Figure 40:
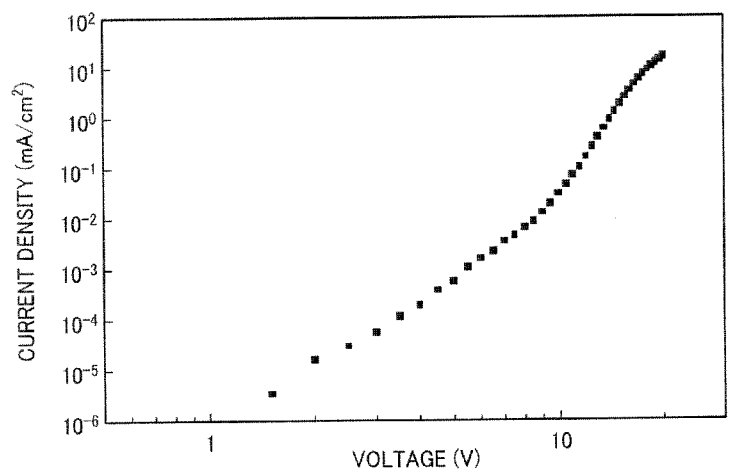
FIG. 40 is a graph illustrating the relationship between the voltage and the current density of the EL device of Comparative Example 2 described later.

FIG. 40 is a graph illustrating the relationship between the voltage and the current density of the EL device of Comparative Example 2.

Figure 41:
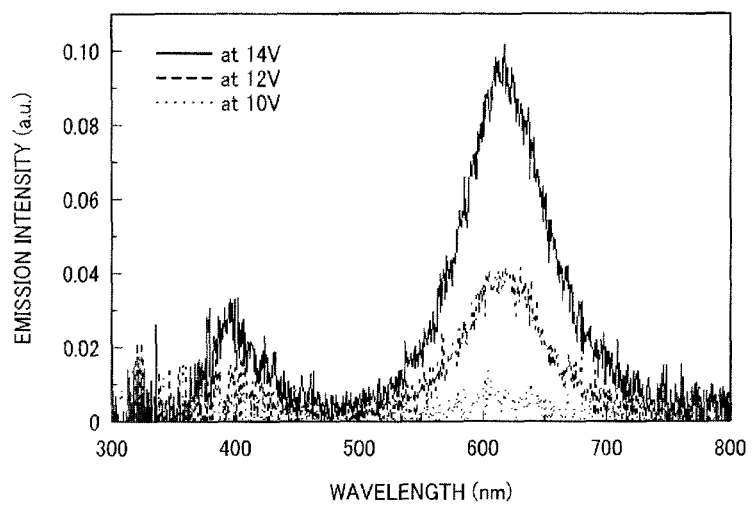
FIG. 41 is a graph illustrating the luminescence spectrum of the EL device of Comparative Example 2 described later.

FIG. 41 is a graph illustrating the luminescence spectrum when the voltage of the EL device of Comparative Example 2 is 10 V, 12 V, and 14 V. As seen in FIG. 41, the center wavelength of the luminescence of the EL device of Comparative Example 2 is found to be 622 nm.

This document claims priority and contains subject matter related to Japanese Patent Applications no. 2010-178148 and 2011-154838, filed on Aug. 6, 2010, and Sep. 13, 2011, respectively, the entire contents of which are hereby incorporated herein by reference.

Having now fully described the invention, it will be apparent to one of ordinary skill in the art that many changes and modifications can be made thereto without departing from the spirit and scope of the invention as set forth therein.

What is claimed as new and desired to be secured by Letters Patent of the United States is:

1. A light emitting device comprising:
a substrate; and
a luminous layer provided overlying the substrate and comprising a semiconductor nanocrystal to which a carbazole derivative is coordination-bonded or attached, the carbazole derivative having aromatic rings of a compound represented by the following chemical structure, which is substituted by one to three substitution groups:

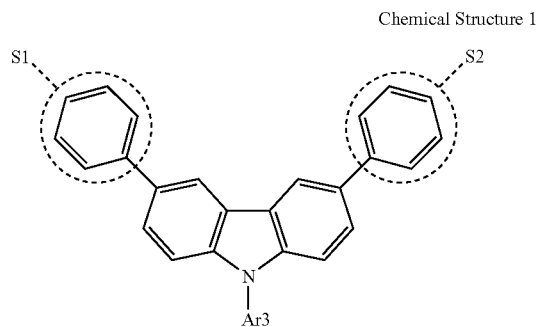

Chemical Structure 1 where $Ar_3$ represents a substituted or non-substituted aryl group,
each of S1 and S2 may have substituents, and the one to three substitution groups are represented by a chemical structure 2:

-X-Y-Z            Chemical Structure 2 where X is a methylene group, a carbonyloxy group, an oxycarbonyl group, a carbonyl group, an oxygen atom, or a sulfur atom, Y is a substituted or non-substituted alkylene group, and Z is a carboxyl group, a hydroxyl group, or a thiol group.

2. The light emitting device according to claim 1, wherein Ar$_3$ is represented by the following chemical structure:

Ar$_4$—X-Y-Z where Ar$_4$ represents a substituted or non-substituted arylene group.

3. A display unit comprising the light emitting device of claim 1.

4. The light emitting device according to claim 1, wherein the carbazole derivative is represented by a chemical structure 8:

Chemical Structure 8

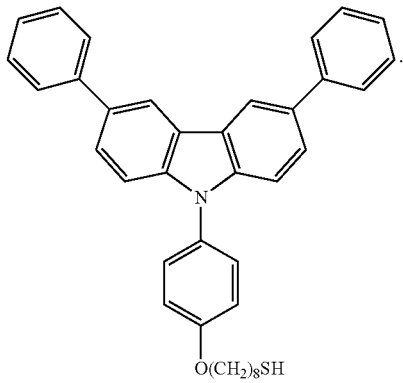

5. The light emitting device according to claim 1, wherein the carbazole derivative is represented by a chemical structure 13:

Chemical Structure 13

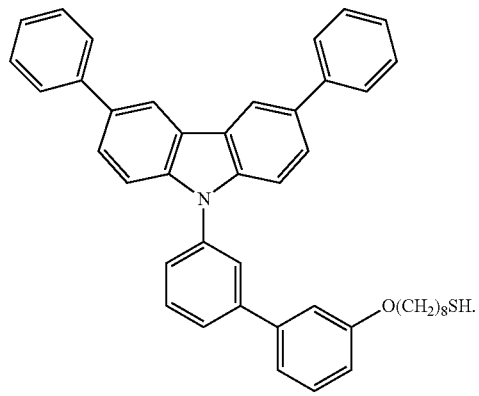

6. The light emitting device according to claim 1, wherein the carbazole derivative is represented by a chemical structure 14:

Chemical Structure 14

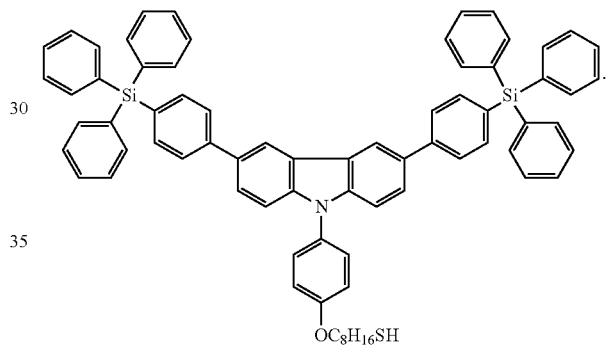

* * * * *